United States Patent
Narui et al.

(10) Patent No.: US 6,954,386 B2
(45) Date of Patent: Oct. 11, 2005

(54) BOOSTED POTENTIAL GENERATION CIRCUIT AND CONTROL METHOD

(75) Inventors: Seiji Narui, Tokyo (JP); Kenji Mae, Fussa (JP); Makoto Morino, Tachikawa (JP); Shuichi Kubouchi, Fussa (JP)

(73) Assignees: Elpida Memory, Inc., Tokyo (JP); Hitachi ULSI Systems Co., Ltd., Tokyo (JP); Hitachi, Ltd., Tokyo (JP)

( * ) Notice: Subject to any disclaimer, the term of this patent is extended or adjusted under 35 U.S.C. 154(b) by 184 days.

(21) Appl. No.: 10/372,000

(22) Filed: Feb. 20, 2003

(65) Prior Publication Data

US 2003/0202390 A1 Oct. 30, 2003

(30) Foreign Application Priority Data

Feb. 21, 2002 (JP) ........................................ 2002-044533

(51) Int. Cl.⁷ .................................................. G11C 7/00
(52) U.S. Cl. ................... 365/189.11; 365/149; 327/536
(58) Field of Search ........................... 365/189.11, 149; 327/536

(56) References Cited

U.S. PATENT DOCUMENTS

| 5,701,096 | A | * | 12/1997 | Higashiho ................ 327/536 |
| 5,754,075 | A | * | 5/1998 | Oh et al. .................... 327/536 |
| 6,166,585 | A | | 12/2000 | Bazzani |
| 6,195,305 | B1 | | 2/2001 | Fujisawa et al. |
| 6,288,601 | B1 | | 9/2001 | Tomishima |
| 6,316,985 | B1 | | 11/2001 | Kobayashi et al. |
| 6,522,191 | B1 | * | 2/2003 | Cha et al. .................. 327/536 |

FOREIGN PATENT DOCUMENTS

| JP | 6-283667 | 10/1994 |
| JP | 11110992 | 4/1999 |
| JP | 11-297950 | 10/1999 |
| JP | 2000-112547 | 4/2000 |

OTHER PUBLICATIONS

Taiwanese Office Action date Aug. 30, 2004 with Translation.
Korean Office Action dated Apr. 29, 2005 with partial translation.

* cited by examiner

Primary Examiner—Huan Hoang
(74) Attorney, Agent, or Firm—Katten Muchin Rosenman LLP

(57) ABSTRACT

A boosted potential generation circuit enables a high-speed operation and even miniaturization in a semiconductor memory even if external power supply voltage is reduced in the semiconductor memory. In the boosted potential generation circuit provided with a capacitor MOS transistor and a transfer MOS transistor and used for a DRAM including memory cells, a gate insulating film of the capacitor MOS transistor is thinner than that of the MOS transistor constituting the memory cell to realize a boosted potential generation circuit which has a small area and a large capacity. In this case, preferably, the gate insulating film of the transfer MOS transistor has a thickness which is not greater than that of the gate insulating film of the capacitor MOS transistor.

22 Claims, 15 Drawing Sheets

BOOSTED POTENTIAL GENERATION CIRCUIT AND CONTROL METHOD

BACKGROUND OF THE INVENTION

1. Field of the Invention

The present invention relates to a boosted potential generation circuit used for a semiconductor integrated circuit, particularly a semiconductor memory, its control method, and its manufacturing method.

2. Description of the Related Art

Generally, in a semiconductor integrated circuit, particularly a semiconductor memory, an external power supply voltage supplied from an external power source tends to be reduced with an increase of a memory capacity. Further, a recent demand is directed to a higher speed of the semiconductor memory. In order to meet such a demand or a requirement, a boosted potential generation circuit is disposed in the semiconductor memory to boost the external power supply voltage. At this boosted potential generation circuit, the external power supply voltage is boosted to voltage necessary for the semiconductor memory, whereby a higher speed is realized in an internal memory cell.

On the other hand, since the increased memory capacity also brings about an increase of electric current consumption, it is necessary to reduce the electric current consumption. Generally, therefore, boosted potential generation circuits are disposed in a plurality of circuits within the semiconductor memory, and each boosted potential generation circuit is designed in accordance with potential necessary for the circuit. In any case, preferably, the boosted potential generation circuit has small electric current consumption and a small chip occupation area, and can generate various boosted potentials only by simple design changing.

A boosted potential generation circuit of such a conventional type is described in Japanese Patent Application Laid-Open No. 2000-112547 (referred to as a reference 1, hereinafter). The boosted potential generation circuit described therein is used together with a substrate potential generation circuit. The boosted potential generation circuit supplies boosted voltage ($V_{PP}$) to a word line of a memory array and a peripheral circuit. On the other hand, the substrate potential generation circuit supplies predetermined negative voltage ($V_{BB}$) to a device substrate. In the case of the reference 1, a constitution is adopted where boosted potential ($V_{PP}$) generated by the boosted potential generation circuit is supplied to the substrate potential generation circuit to obtain desired voltage from this boosted potential ($V_{PP}$).

Further, the substrate potential generation circuit described in the reference 1 is constituted of an oscillator such as a ring oscillator for generating clocks, and a charge pump circuit. In this case, at the charge pump circuit, a clock from the oscillator and a clock inversion signal are supplied to a plurality of capacitive elements and a transistor to boost voltage, and control is executed to prevent excessively high boosted potential caused by clamping of a voltage level.

The adoption of the above constitution enables use of a thin transistor of a gate oxide film (referred to as a gate insulating film, hereinafter) as the transistor used for the charge pump circuit. However, the reference 1 explains only the constitution of the substrate potential generation circuit, and discloses nothing concerned with a constitution of the boosted potential generation circuit for generating boosted voltage ($V_{PP}$) from external voltage ($V_{DD}$).

On the other hand, Japanese Patent Application Laid-Open No. 297950/1999 (referred to as a reference 2, hereinafter) discloses a semiconductor integrated circuit device where a MOSFET having a thick gate insulating film is disposed in a first internal circuit operated by receiving boosted voltage ($V_{PP}$) generated by an internal voltage generation section, and a second internal circuit operated by receiving stepped-down voltage ($V_{DL}$) is constituted of a MOSFET having a thin gate insulating film. However, the reference 2 discloses only the circuit operated by receiving the boosted voltage, but nothing concerned with a constitution of the circuit for generating boosted voltage.

Further, Japanese Patent Application Laid-Open No. 283667/1994 (referred to as a reference 3, hereinafter) presents a high voltage generation circuit used to generate high voltage necessary for deletion or writing of a nonvolatile memory. This presented high voltage generation circuit is provided with a plurality of MOS transistors and boosting capacitive elements connected to mutual connection nodes of these transistors and, as insulating films of the plurality of boosting capacitive elements, films having two or more types of thickness are used. According to the reference 3, it is possible to constitute a high voltage generation circuit having a small pattern area and operated by low voltage.

However, also in the reference 3, nothing is disclosed in connection with requirements and a specific constitution of a boosted voltage generation circuit used for a DRAM.

Now, description will be made of a specific constitution and requirements of the boosted voltage generation circuit generally used for a DRAM.

Recent achievement of a higher density and miniaturization of a memory cell in the DRAM have also brought about a reduction of external power supply voltage $V_{DD}$, for example from 5V to 2V or about 1.8V Such a reduction of the external power supply voltage to about 1.8V necessitates generation of voltage of 3.0V or higher (i.e., 3.0V to 3.9V) as boosted voltage ($V_{PP}$) at the boosting circuit of the internal voltage generation circuit.

Conventionally, the boosted voltage generation circuit of the above type used for the DRAM is constituted of an oscillator and a charge pump circuit and, as the charge pump circuit, a double or triple boosted voltage generation circuit is used. Here, it must be kept in mind that the boosting circuit of this type is used not only for supplying boosted potential to the word line but also for supplying boosted potential or overdrive potential to a shared MOS transistor, a bit line precharge MOS transistor, and a sense amplifier, and used as control signals therefor.

However, in the aforementioned constitution of the boosting circuit using the conventional boosted voltage generation circuit, a situation has arisen where various power potentials including the word line boosted voltage ($V_{PP}$) cannot be supplied sufficiently to the memory array.

Further, in the semiconductor memory, particularly the DRAM, as described above, even if the external power supply voltage is reduced, a transfer gate of the memory cell array and the sense amplifier regarding data transfer are operated by boosted voltage, and a sufficient writing level of the memory cell is secured to carry out an operation at a much higher speed.

In this connection, generally, for the MOS transistor constituting a DRAM memory cell, a MOS transistor having a relatively thick gate insulating film (e.g., 6 nm) which withstands the boosted voltage is used and, for the MOS transistor constituting a peripheral circuit operated by external power supply voltage, a MOS transistor having a thin gate insulating film (e.g., 3.5 nm) is used Specifically, in the DRAM provided with the word line, the bit line, the memory cell and the sense amplifier, if the sense amplifier is stepped down together with a reduction of the external power supply voltage, an operation speed of the sense amplifier is lowered, and thus the sense amplifier must be operated by boosted voltage. Additionally, in order to carry out precharging of the bit line and a writing operation of the memory cell at a high speed, gate voltage for controlling the operations of these transistors must be boosted. As a result, it is impossible to make thin the gate oxide film of the MOS transistor constituting the memory cell.

On the other hand, the boosted voltage generation circuit for generating various voltages for the DRAM is provided with a capacitor MOS transistor and a transfer MOS transistor. Generally, however, because of application of boosted voltage, these MOS transistors are constituted of MOS transistors having film thickness equal to that of the gate oxide film of the MOS transistor of the memory cell.

Further, as described above, in the case of generating corresponding internal power potentials in various circuits, if the boosted voltage generation circuit for generating double boosted potential from the external power supply voltage, various power potentials including word line boosted potential necessary for the DRAM cannot be generated. For example, as the external power supply voltage is reduced, there is a tendency for requiring supplying of, in addition to the word line boosted potential, potentials for controlling the shared MOS transistor, the bit line precharge MOS transistor, and/or overdriving of the sense amplifier to the boosted potential generation circuit.

Considering the foregoing, from now on, the boosted potential generation circuit may need to generate high boosted potential of 3.0 to 3.9V or higher.

On the other hand, in order to obtain the aforementioned high boosted potential, as in the conventional case, the use of a double boosted potential generation circuit is assumed. First, current efficiency of the boosted potential generation circuit is normally represented by a ratio between load current and current consumption (i.e., load current/current consumption). However, if the double boosted potential circuit is used to generate high voltage, as generated voltage becomes higher, a sharp reduction occurs in current efficiency. As a result, if the double boosted potential generation circuit is used to generate high boosted potential, there is a drawback that a sufficient current supplying capability cannot be obtained because of the impossibility of preventing a reduction in current efficiency. Additionally, in order to obtain a sufficient current supplying capability by using the double boosted potential generation circuit, the capacitor MOS transistor must be enlarged, which consequently increases a chip size.

Under such circumstances, consideration has also been given to the use of the triple boosted potential generation circuit for stably maintaining current efficiency even at high boosted potential. However, in the triple boosted potential generation circuit, since generated voltage itself is high, as a MOS transistor used for the boosted potential generation circuit, a capacitor MOS transistor of a thick gate insulating film must be used to withstand the high voltage. This means that also in the triple boosted potential generation circuit, as a capacitor MOS transistor for obtaining a desired capacitance value, a MOS transistor of a thick gate insulating film must be used.

However, the capacitor MOS transistor having the thick gate insulating film must increase its area in order to realize a desired capacitance value. As a result, there is a drawback that the boosted potential generation circuit cannot be formed by a small area because of a large chip size.

Additionally, as the external power supply voltage is reduced, consideration may also be given to the use of a MOS transistor having a thin gate insulating film used for a peripheral circuit as each of the capacitor MOS transistor and the transfer MOS transistor of the boosted potential generation circuit in accordance with a scaling rule.

However, if the boosted potential generation circuit using the thin transfer MOS transistor is used, since high potential cannot be supplied to the gate insulating film, high boosted potential cannot be obtained. As a result, there is also a drawback that a demand for a higher speed of the semiconductor memory cannot be satisfied because of the impossibility of executing a high-speed operation.

An object of the present invention is to provide a boosted potential generation circuit suitable for a semiconductor memory, which enables generation of not only double boosted potential but also various potentials in accordance with a reduction in external power supply voltage.

An object of the present invention is to provide a boosted potential generation circuit capable of obtaining a large current supplying capability without increasing a chip side, and its control method.

Another object of the present invention is to provide circuitry capable of increasing an achievement level and a current supplying capability while suppressing an increase in current consumption, which can be used for a boosted potential generation circuit.

Yet another object of the present invention is to provide a boosted potential generation circuit of a small area and high efficiency by optimizing a gate insulating film of a MOS transistor.

The other object of the present invention is to provide a control method for optimally driving the aforementioned boosted potential generation circuit.

SUMMARY OF THE INVENTION

According to an aspect of the present invention, there is provided a boosted potential generation circuit used for a semiconductor device including a memory cell constituted of a MOS transistor, comprising: a capacitor MOS transistor used as a capacitive element and connected between first and second nodes; a transfer MOS transistor connected to the second node; and a precharge MOS transistor connected to the second node, wherein gates of the capacitor MOS transistor, the transfer MOS transistor and the precharge MOS transistor are controlled to prevent a potential difference between the first and second nodes of the capacitor MOS transistor from exceeding withstand pressure of a gate insulating film of the capacitor MOS transistor.

In this case, preferably, the capacitor MOS transistor has a gate insulating film thinner than a gate insulating film of the MOS transistor constituting the memory cell or the transfer MOS transistor.

Specifically, control signals are supplied as first and second clocks to the gates of the capacitor MOS transistor and the precharge MOS transistor, a control signal is supplied as a third clock to the gate of the transfer MOS transistor, a charge pump period of the capacitor MOS transistor defined by the first clock is controlled not to overlap with a precharge period of the precharge MOS transistor defined by the second clock, and a transfer period defined by the third clock controlled to be shorter than the charge pump period.

According to this constitution, external power supply voltage is supplied to the precharge MOS transistor, and potential twice as large as the external power supply voltage is generated from the transfer MOS transistor.

According to another aspect of the present invention, there is provided a boosted potential generation circuit for boosting external power supply voltage, comprising: a first capacitor MOS transistor connected between first and second nodes; a second capacitor MOS transistor connected between third and fourth nodes; a first precharge MOS transistor connected between a power supply terminal to which the external power supply voltage is supplied, and the second node; a second precharge MOS transistor connected between the power supply terminal and the fourth node; and a transfer MOS transistor connected to the fourth node, wherein a switch circuit is disposed between the second and third nodes, and potential three times as large as the external power supply voltage is generated from the transfer MOS transistor.

In this case, the first and second capacitor MOS transistors are constituted of MOS transistors having gate insulating films thinner than a gate insulating film of a MOS transistor constituting the memory cell or the transfer MOS transistor, and the switch circuit is constituted of a first MOS transistor connected between the second and third nodes, and second and third MOS transistors connected between the third node and a ground.

Specifically, first, second, third, fourth and fifth clocks are respectively supplied as control signals to the first capacitor MOS transistor, the first precharge MOS transistor, the switch circuit, the second precharge MOS transistor and the transfer MOS transistor, and preferably a charge transfer period of the transfer MOS transistor defined by the fifth clock is controlled to substantially overlap with a is charge pump period of the first capacitor MOS transistor defined by the first clock, but not to overlap substantially with a precharge period defined by the second and fourth clocks.

According to another aspect of the present invention, there is provided a boosted potential generation circuit, wherein the transfer MOS transistor is constituted of a P channel MOS transistor, and the switch circuit has a P channel first MOS transistor connected between the second and third nodes, and N channel second and third MOS transistors connected in series between the third node and a ground.

According to the other aspect of the present invention, there is provided a control method of a boosted potential generation circuit including a capacitor MOS transistor provided with a gate insulating film of a predetermined thickness, a transfer MOS transistor provided with a gate insulating film thicker than the gate insulating film of the capacitor MOS transistor, and a precharge MOS transistor connected to the capacitor MOS transistor and the transfer MOS transistor, comprising the steps of: supplying a first clock for defining a charge pump period to the capacitor MOS transistor; supplying a second clock for deciding a precharge period finished before a start of the charge pump period by the first clock to the precharge MOS transistor; and supplying a third clock for defining a charge transfer period to the transfer MOS transistor within the charge pump period by the first clock, whereby voltage applied to the capacitor MOS transistor in the boosting period is limited

DESCRIPTION OF THE PREFERRED EMBODIMENTS

Figure 1:
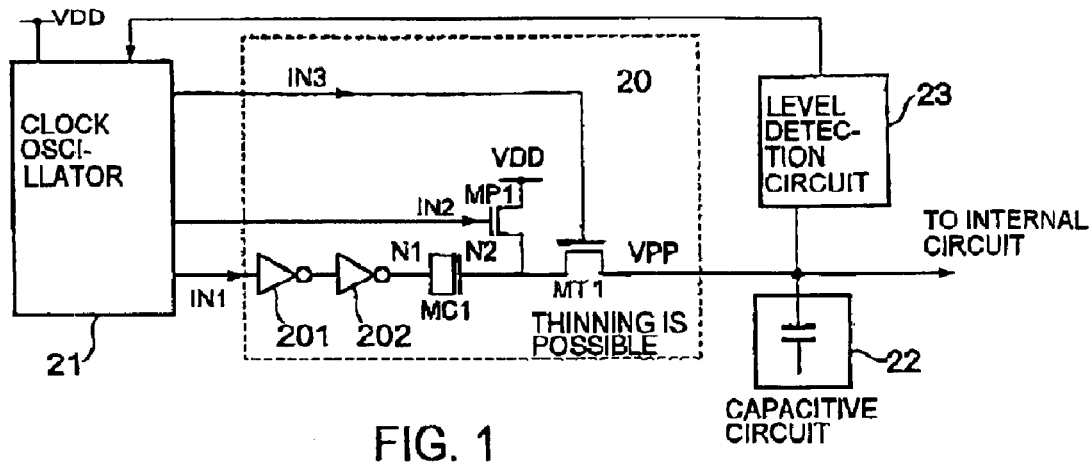
FIG. 1 is a view explaining a boosted potential generation circuit according to a first embodiment of the present invention.
Figure 2:
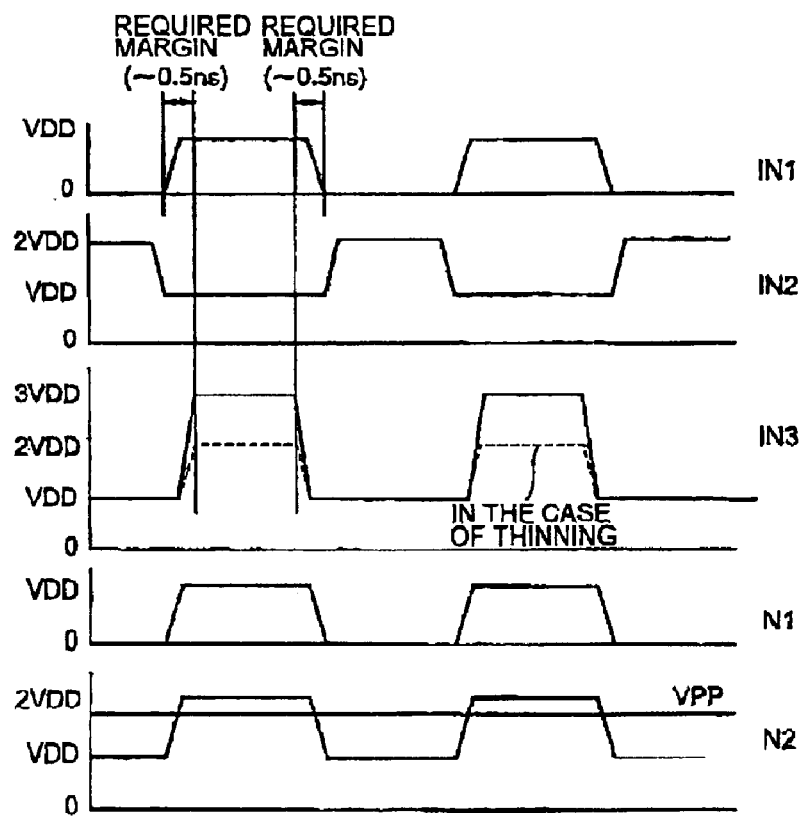
FIG. 2 is a waveform chart explaining an operation of the boosted potential generation circuit shown in FIG. 1.

FIG. 1 shows circuitry including a boosted potential generation circuit 20 of a first embodiment of the present invention, and FIG. 2 shows a waveform chart for explaining its operation.

The boosted potential generation circuit 20 shown in FIGS. 1 and 2 is provided with a clock oscillator 21 at an input side, and a capacitive circuit 22 and a level detection circuit 23 at an output side. Voltage of 1.8V is supplied as external power supply voltage $V_{DD}$ to the clock oscillator 21, and first, second and third clocks IN1, IN2 and IN3 are supplied from this external power supply voltage $V_{DD}$ by later described timings. In this case, the first to third clocks IN1 to IN3 may also be called control signals because they have roles of control signals.

The capacitive circuit 22 at the output side smoothes output voltage of the boosted potential generation circuit 20 to generate internal boosted potential $V_{PP}$ of about 2.9V, which is supplied to an internal circuit of the semiconductor memory. The level detection circuit 23 detects the internal boosted potential $V_{PP}$. If boosted potential equal to/higher than predetermined potential $V_{PP}$ is obtained, it is fed back to the clock oscillator 21 to stop its operation. If boosted potential is lower than the predetermined potential, the clock oscillator 21 is operated.

The clock oscillator 21, the capacitive circuit 22 and the level detection circuit 23 are similarly used in the other embodiments. However, description thereof will be omitted for the sake of simplified explanation.

The boosted potential generation circuit 20 is provided with a MOS transistor (capacitor MOS transistor) MC1 as a capacitive element for boosting by receiving the first clock IN1 through inverters 201, 202, i.e., executing charge pump operation, a transfer MOS transistor MT1 connected to the capacitor MOS transistor MC1, and a precharge transistor MP1 connected between both transistors MC1 and MT1. Additionally, as shown, the capacitor MOS transistor MC1 is connected between a substrate side node (first node N1) and a gate side node (second node N2).

Among the shown transistors MC1, MT1 and MP1, the transistors MC1 and MP1 are constituted of MOS transistors having thin gate insulating films, while the transistor MT1 is constituted of a MOS transistor having a thick gate insulating film. It is assumed that a thickness of the gate insulating film of the transfer MOS transistor MT1 is equal to that of a gate insulating film of a MOS transistor constituting a memory cell of a DRAM (here, DRAM of a one-transistor and one-cell type). In this example, it is assumed that a thickness of each of the gate insulating films (thick gate insulating films) of the transfer MOS transistor MT1 and the MOS transistor constituting the memory cell of the DRAM is set to 6 nm. On the other hand, a thin insulating film is a gate insulating film used for the MOS transistor operated by voltage equal to/lower than power supply voltage $V_{DD}$ supplied from the outside, and its thickness is set to, e.g., 3.5 nm.

To clarify a difference in film thickness among the MOS transistors, FIG. 1 shows the gate parts of the MOS transistors MC1, MP1 by thin lines, and the gate part of the MOS transistor MT1 by a thick line. Thus, it can also be understood from the drawing that the shown transfer MOS transistor MT1 has a gate insulating film thicker than those of the capacitor MOS transistor MC1 and the precharge MOS transistor MP1. Additionally, the shown MOS transistors are all N channel MOS transistors.

Then, in the shown example, the first clock IN1 is supplied through the inverters 201, 202 to the capacitor MOS transistor. However, these inverters 201, 202 may be installed in the clock oscillator 21, and the number of inverters 202, 202 needs not be limited to two. In the shown example, in the period of the first clock IN1 to a high level ($V_{DD}$), the capacitor MOS transistor C1 executes a in charge pump operation. Accordingly, the first clock IN1 defines a charge pump period of the capacitor MOS transistor MC1.

Further, the second clock IN2 is supplied from the clock oscillator 21 to the precharge MOS transistor MP1, and power supply voltage $V_{DD}$ is supplied to a drain. A source thereof is connected to a common connection point of the capacitor MOS transistor MC1 and the transfer MOS transistor MT1. According to this constitution, while the second clock IN2 is at a high level ($2V_{DD}$), the precharge MOS transistor MP1 is turned ON to precharge the capacitor MOS transistor MC1. Thus, it can be understood that the second clock IN2 defines a precharge period and, in the shown example, there is no overlapping between the precharge period and the charge pump period.

On the other hand, the third clock IN3 is supplied from the clock oscillator 21 to a gate of the transfer MOS transistor MT1. While the third clock IN3 is at a high level ($3V_{DD}$), the transfer MOS transistor MT1 is turned ON to transfer charge. Thus, the third clock IN3 defines a charge transfer period of the transfer MOS transistor MT1, and there is no overlapping between the charge transfer period and the precharge period.

By referring to FIG. 2, the operation of the boosted potential generation circuit 20 shown in FIG. 1 will be described more specifically. First, as shown in FIG. 2, the clock oscillator 21 generates the first clock IN1 of voltage amplitude $V_{DD}$ changed from 0 potential to $V_{DD}$, the second clock IN2 of voltage amplitude $V_{DD}$ changed from $2V_{DD}$ to $V_{DD}$, and the third clock IN3 of voltage amplitude $2V_{DD}$ changed from $V_{DD}$ to $3V_{DD}$.

As apparent from FIG. 2, the second clock IN2 is reduced from $2V_{DD}$ to the $V_{DD}$ level and, after the end of precharging, while the second clock IN2 is at the $V_{DD}$ level and the precharge MOS transistor MP1 is OFF, the first clock IN1 is raised to the $V_{DD}$ level to charge-pump the capacitor MOS transistor MC1. Also, while the first clock IN1 is at the $V_{DD}$ level, the third clock IN3 is raised to $3V_{DD}$. As a result, the transfer MOS transistor MT1 is turned ON to supply charge of the capacitor MOS transistor MC1 through the transfer MOS transistor MT1 to the internal circuit of the semiconductor memory. Thus, the third clock IN3 is controlled to accurately rise while the first clock IN1 is at the $V_{DD}$ level. In other words, a pulse width of the first clock IN1 is larger than that of the third clock IN3 by a width of margin (e.g., 0.5 ns) in each of front and rear edges. Similarly, a low-level period of the second clock IN2 is controlled to be longer than the high-level period of the first clock IN1.

The clock oscillator 21 for generating the first to third clocks IN1 to IN3 having the aforementioned voltage amplitude by the aforementioned timings can be easily realized by using a normal circuit technology, and thus detailed description thereof is omitted.

In FIG. 2, waveforms of the respective nodes N1 and N2 shown in FIG. 1 are shown together with those of the first to third clocks IN1 to IN3. As apparent from FIG. 2, before the generation of the first clock IN1, the level of the second clock IN2 is changed from the $2V_{DD}$ level to the $V_{DD}$ level. This means that before the first clock IN1 rises, precharging by the precharge MOS transistor MP1 is finished, and the precharge MOS transistor MP1 is turned OFF.

In this state, when the first clock IN1 is supplied through the inverters 201, 202 to the capacitor MOS transistor MC1, potentials of the first and second node N1 and N2 of the capacitor MOS transistor MC1 are changed as shown in FIG. 2. In the capacitor MOS transistor MC1, the potential of the second mode N2 is always set higher than that of the first node N1. That is, the potential of the first node N1 of the capacitor MOS transistor MC1 is, as in the case of the first clock IN1, changed between ground potential 0 and $V_{DD}$ potential in synchronization with the first clock IN1, while the potential of the second node N2 of the capacitor MOS transistor MC1 is precharged to $V_{DD}$ potential by the precharge MOS transistor MP1, and thus changed, as shown in FIG. 2, between the $V_{DD}$ potential and the $2V_{DD}$ potential in synchronization with the first clock.

Now, referring to the waveforms of the potentials of the second and first nodes N2 and N1, in the constitution of the boosted potential generation circuit 20 shown in FIG. 1, a potential difference between the second node N2 and the first node N1 is always maintained at $V_{DD}$, and this potential difference is maintained constant not exceeding the $V_{DD}$. Accordingly, as the capacitor MOS transistor MC1, compared with the MOS transistor constituting the memory cell and the gate insulating film of the transfer MOS transistor, a MOS transistor having a thinner gate insulating film is used to obtain a desired capacitance value. This means that the capacitor MOS transistor MC1 having a small area and a desired capacitance can be constituted.

Further referring to FIG. 2, the third clock IN3 changed between potentials of $V_{DD}$ (low level) and $3V_{DD}$ (high level) is supplied to the transfer MOS transistor MT1 connected to the gate side node N2 of the capacitor MOS transistor MC1. In the shown example, while potential of the gate side node N2 is $2V_{DD}$, the third clock IN3 supplied to the gate of the transfer MOS transistor MT1 is set to a high level. As a result, while the third clock IN3 is at the high level, the transfer MOS transistor MT1 is turned ON to transfer charge from the capacitor MOS transistor MC1 to the capacitive circuit 22. The capacitive circuit 22 smoothes the transferred charge to generate boosted voltage $V_{PP}$. In the shown example, while the first clock IN1 is at the high level, a boosting period is regulated. On the other hand, while the second clock IN2 is at the high level, the precharging period of the precharge MOS transistor MP1 is regulated, and adjusted not to overlap with the boosting period. In other words, it can be understood that in the example, boosting is executed during a period of no precharging. Additionally, the high-level period of the third clock IN3 defines the charge transfer period of the transfer MOS transistor MT1, which is adjusted to be shorter than the boosting period.

According to the aforementioned constitution, since the transfer MOS transistor MT1 transfers the charge after the precharging of the precharge MOS transistor MP1 is completely finished, and it is further boosted, the charge transfer can be surely executed. Additionally, the third clock IN3 having potential $3V_{DD}$ higher than $V_{DD}$ is supplied to the transfer MOS transistor MT1 to turn it ON. As in the shown example, the MOS transistor having a thick gate insulating film is used as the transfer MOS transistor MT1, and the transfer MOS transistor is driven by the third clock IN3 having voltage amplitude of $3V_{DD}$, whereby the charge can be quickly transferred, and a sufficient current supplying capability can be obtained.

As apparent from the foregoing, the clocks IN1 to IN3 are used to control the shown transistors, whereby the MOS transistor having a thin gate insulating film can be used as the capacitor MOS transistor MC1.

This means that the MOS transistor of a thin gate insulating film and low withstand pressure can be used as the capacitor MOS transistor. The capacitor MOS transistor having the thin gate insulating film can realize a large capacitance by a small area, and it is effective for reducing a chip size. For example, use of a MOS transistor having a gate insulating film of a thickness 3.5 nm as the capacitor MOS transistor enables reduction of an area required by the boosted potential generation circuit by about 30% compared with the case of using the MOS transistor constituting the memory cell or the MOS transistor having a gate insulating film of a thickness 6.0 nm used for the transfer MOS transistor as the capacitor MOS transistor.

In the case of using the aforementioned boosted potential generation circuit for the DRAM, if external power supply voltage $V_{DD}$ is 1.8V, desired boosted potential is 2.9V, and a threshold of the transfer MOS transistor is 0.5V, boosted potential of the node N2 is 2×1.8V (3.6V) and, at this time, a gate level (IN3) of the transfer MOS transistor MT1 is 3×1.8V (5.4V). In this case, potential between the gate and the source of the transfer MOS transistor MT1 is a potential difference equal to/higher than the threshold, whereby transfer of charge from the node N2 can be quickly executed.

As described above, a margin is supplied to rising/falling of each clock signal, and a difference of potential applied to the capacitor MOS transistor MC1 is controlled to be within the $V_{DD}$. Therefore, it is possible to make thin the gate insulating film in the capacitor MOS transistor MC1.

Additionally, in the embodiment, the gate insulating film of the transfer MOS transistor is made thick. However, as shown in FIGS. 1 and 2, the high level of the clock IN3 can be set to $2V_{DD}$ to realize a thin gate film.

Also in this case, potential between the gate and the source of the transfer MOS transistor MT1 is as follows:

$$2 \times V_{DD} - V_{PP} = 2 \times 1.8 - 2.9 = 0.7V$$

The transfer MOS transistor MT1 is accordingly turned ON to transfer charge.

Thus, the thinning of all the MOS transistors enables a boosted potential generation circuit of a smaller area to be obtained. Conversely, the gate film of the precharge MOS transistor MP1 may be made thick. However, since large voltage fluctuation occurs when boosted potential is supplied to the internal circuit, more preferably, the transfer MOS transistor MT1 has a thick gate film in the embodiments including later-described other embodiments.

Figure 3:
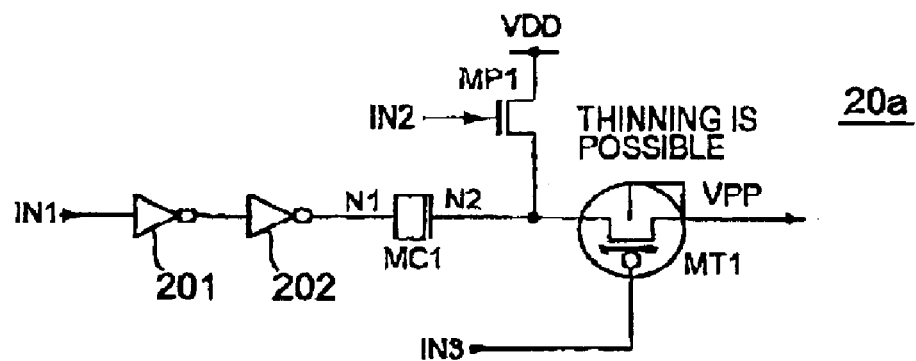
FIG. 3 is a circuit diagram explaining a boosted potential generation circuit according to a second embodiment of the present invention.
Figure 4:
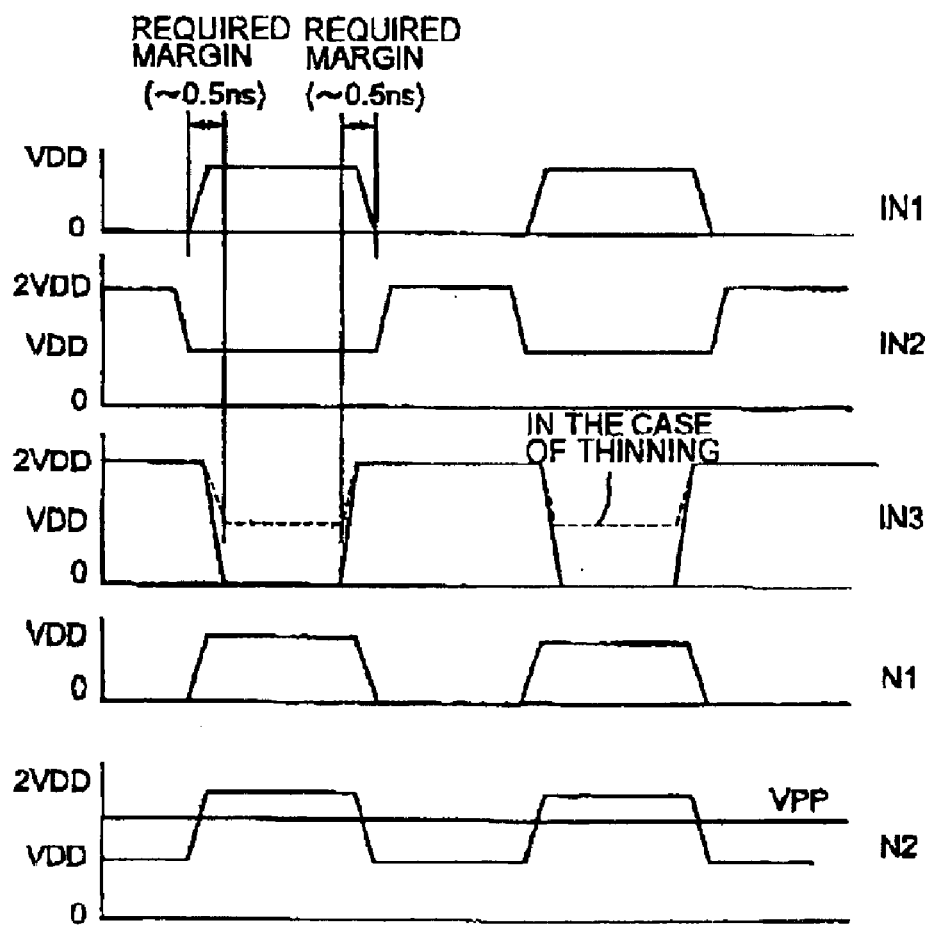
FIG. 4 is a waveform chart explaining an operation of the boosted potential generation circuit shown in FIG. 3.

Referring to FIG. 3, there is shown a boosted potential generation circuit 20a of a second embodiment of the present invention, which is similar to the boosted potential generation circuit 20 shown in FIG. 1 except for use of a P channel MOS transistor having a thick gate insulating film as a transfer MOS transistor MT1. Additionally, because of the use of the P channel MOS transistor as the transfer MOS transistor MT1, a third clock IN3 supplied to a gate of the P channel MOS transistor has, as shown in FIG. 4, a polarity different from that of the third clock IN3 of FIG. 2. That is, the third clock IN3 shown in FIG. 4 has voltage amplitude changed between $2V_{DD}$ and 0 potential. According to a constitution shown in FIG. 3, by the third clock IN3, as in the case of FIG. 1, double boosted voltage $V_{PP}$ of external power supply voltage $V_{DD}$ can be generated.

Furthermore, in the case of making thin the transfer MOS transistor MT1, as indicated by a dotted line of FIG. 4, the use of the third clock IN3 of low-level $V_{DD}$ enables thinning of all the MOS transistors. However, boosted potential may be greatly reduced because the boosted potential supplied to the internal circuit is used therein and, in order to supply the boosted potential to the internal circuit at a high speed by applying high control voltage, more preferably, the gate film of the transfer MOS transistor is made thick.

Now, by referring to FIG. 5, description will be made of a boosted potential generation circuit of a third embodiment of the present invention.

Figure 5:
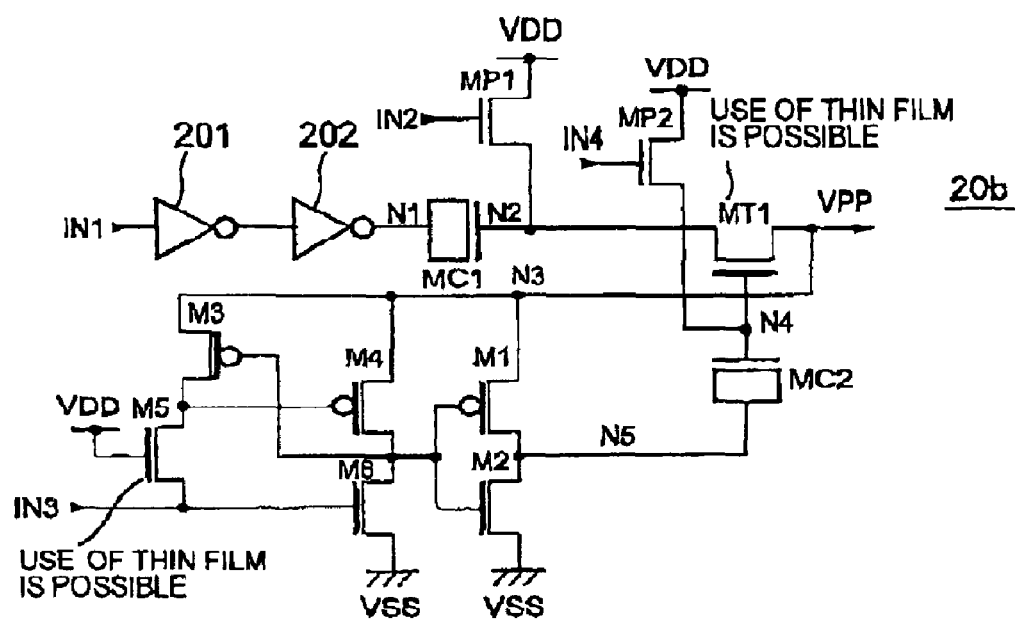
FIG. 5 is a circuit diagram explaining a boosted potential generation circuit according to a third embodiment of the present invention.

The boosted potential generation circuit 20b shown in FIG. 5 has a constitution of a connected level conversion circuit in addition to the components of the constitution shown in FIG. 1, and generates double potential $V_{PP}$ of external power supply voltage $V_{DD}$. The boosted potential generation circuit 20b is provided, as in the case of FIG. 1, with a capacitor MOS transistor MC1 (referred to as a first capacitor MOS transistor, hereinafter), a precharge MOS transistor MP1 (referred to as a first precharge MOS transistor, hereinafter), and a transfer MOS transistor, and it has first to sixth MOS transistors M1 to M6, and a level conversion circuit constituted of a second capacitor MOS transistor MC2. A first clock IN1 is supplied to the first capacitor MOS transistor MC1 through inverters 201, 202, and a second clock IN2 is supplied to the precharge MOS transistor MP1. A third clock IN3 is supplied through the level conversion circuit to a gate of the transfer transistor MT1, and a source of the second precharge MOS transistor MP2 is connected thereto. A fourth clock IN4 is supplied to a gate of the second precharge MOS transistor MP2.

Further, the first to sixth MOS transistors M1 to M6 constituting the level conversion circuit are constituted of transistors having thick gate insulating films because boosted voltage $V_{PP}$ higher than external power supply voltage $V_{DD}$ is applied.

Specifically, the first, third and fourth MOS transistors M1, M3 and M4 constituting the shown level conversion circuit are P channel MOS transistors, while the remaining MOS transistors M2, M5 and M6 are N channel MOS transistors. The first and second MOS transistors M1 and M2 are connected in series between a node N3 receiving potential similar to that of an output terminal of the boosted potential generation circuit and ground potential $V_{SS}$, and the fourth and sixth MOS transistors M4 and M6 are also connected in series. Further, a drain common connection point of the first and second MOS transistors M4 and M6 is connected to a substrate side of the second capacitor MOS transistor MC2. On the other hand, a common connection point of the fourth and sixth MOS transistors M4 and M6 is connected to gates of the first and second MOS transistors M1 and M2, and also connected to a gate of the third MOS transistor M3.

The third and fifth MOS transistors M3 and M5 are connected in series between the node N3 and a terminal of the third clock IN3, and a common connection point thereof is connected to a gate of the fourth MOS transistor M4. Additionally, a source of the fifth MOS transistor M5 is connected to a gate of the sixth MOS transistor M6, and the third clock IN3 is supplied to the source of the fifth MOS transistor M5. Further, the gate of the fifth MOS transistor M5 is connected to the $V_{DD}$.

A gate side of the second capacitor MOS transistor MC2 is connected through a node N4 to the transfer MOS transistor MT1, and the node N4 is connected to a source of the second precharge MOS transistor MP2.

As shown, external power supply voltage $V_{DD}$ is supplied to the drains of the first and second precharge MOS transistors MP1 and MP2, and the gate of the fifth MOS transistor M5, while the sources of the second and sixth MOS transistors M2 and M6 are connected to the ground potential $V_{SS}$.

Figure 6:
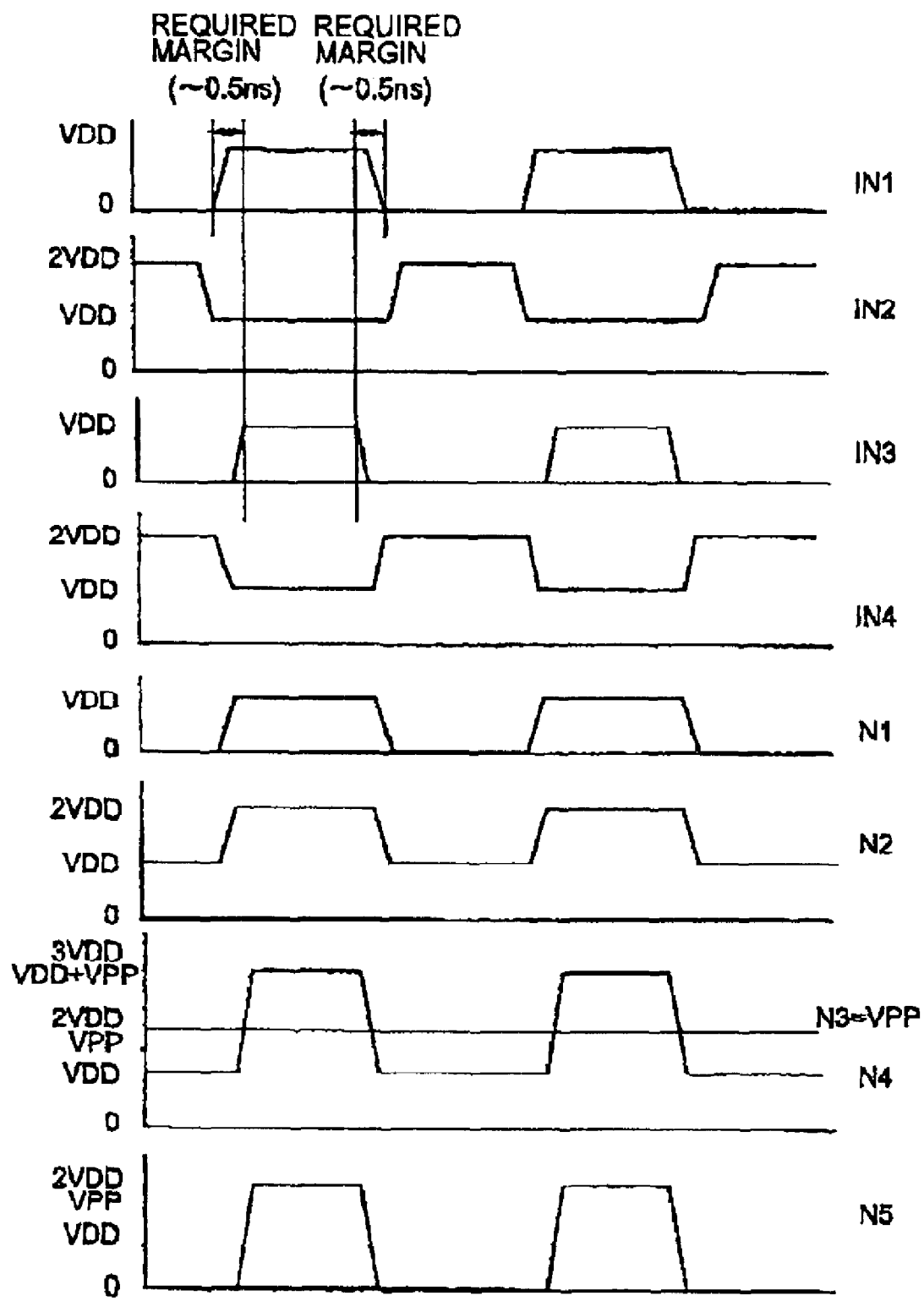
FIG. 6 is a waveform chart explaining an operation of the boosted potential generation circuit shown in FIG. 5.

Now, description will be made of an operation of the boosted potential generation circuit 20b shown in FIG. 5 by referring to a waveform chart of FIG. 6. First, as shown in FIG. 5, the first clock IN2 has, as in the case of FIG. 2, voltage amplitude $V_{DD}$ and changes from a 0 level (low level) to a $V_{DD}$ level (high level), while the second clock IN2 changes from a $2V_{DD}$ level (high level) to a $V_{DD}$ level (low level). Here, a high-level period of the first clock IN1 is set shorter than a low-level period of the second clock IN2. Further, the third clock IN3 changes from a 0 level (low level) to a $V_{DD}$ level (high level), and its high-level period is adjusted to be shorter than the high-level period of the first clock IN1. Further, the fourth clock IN4 has a polarity opposite that of the first clock IN1, and changes from a $2V_{DD}$ level (high level) to $V_{DD}$ (low level). The first to fourth clocks IN1 to IN4 are generated by the clock oscillator 21 as in the case of FIG. 1.

While the second clock IN2 Is at a high level ($2V_{DD}$) and the fourth clock IN4 is also at a high level ($2V_{DD}$), the first and second precharge MOS transistors MP1 and MP2 are ON. At this time, potentials of the nodes N1 and N2 of the first capacitor MOS transistor MC1 are, as shown in FIG. 6, respectively 0 and $V_{DD}$ levels. The node N4 is set to a $V_{DD}$ level. This is attributed to the fact that the third clock IN3 is set to a low level and, in this state, the fifth, fourth and second MOS transistors M5, M4 and M2 are turned ON, and the node N5 of the second capacitor MOS transistor MC2 is set to a low level ($V_{SS}$).

Subsequently, the second clock IN2 changes to a low level and, when the first clock IN1 becomes a high level and the fourth clock IN4 becomes a low level, the first and second precharge MOS transistors MP1 and MP2 are turned OFF. At this time, potential of the node N3 is maintained roughly at $V_{PP}$. In this state, when the third clock IN3 becomes a high level, the sixth and first MOS transistors M6 and M1 are turned ON and, as a result, through the node N3, boosted potential $V_{PP}$ is supplied to the node N5 of the second capacitor MOS transistor MC2. Thus, the gate side potential of the node N4 of the second capacitor MOS transistor MC2 is, as shown in FIG. 6, raised to $V_{DD}+V_{PP}$. Since the potential $V_{PP}$ is higher than the potential $V_{DD}$, as shown in FIG. 6, potential of the gate of the transfer MOS transistor MT1 connected to the node N4 exceeds $2V_{DD}$ to reach a level approaching $3V_{DD}$. Therefore, as in the case of FIG. 1, the transfer MOS transistor MT1 can quickly transfer charge and, through the capacitive circuit 22, roughly constant boosted potential $V_{PP}$ can be generated.

According to this embodiment, the transfer MOS transistor MT1 can be made thin. However, as described above with reference to FIG. 4, boosted potential may be greatly reduced because the boosted potential supplied to the internal circuit is used therein and, in order to supply the boosted potential to the internal circuit at a high speed by high control voltage, more preferably, the gate film of the transfer MOS transistor is made thick.

Figure 7:
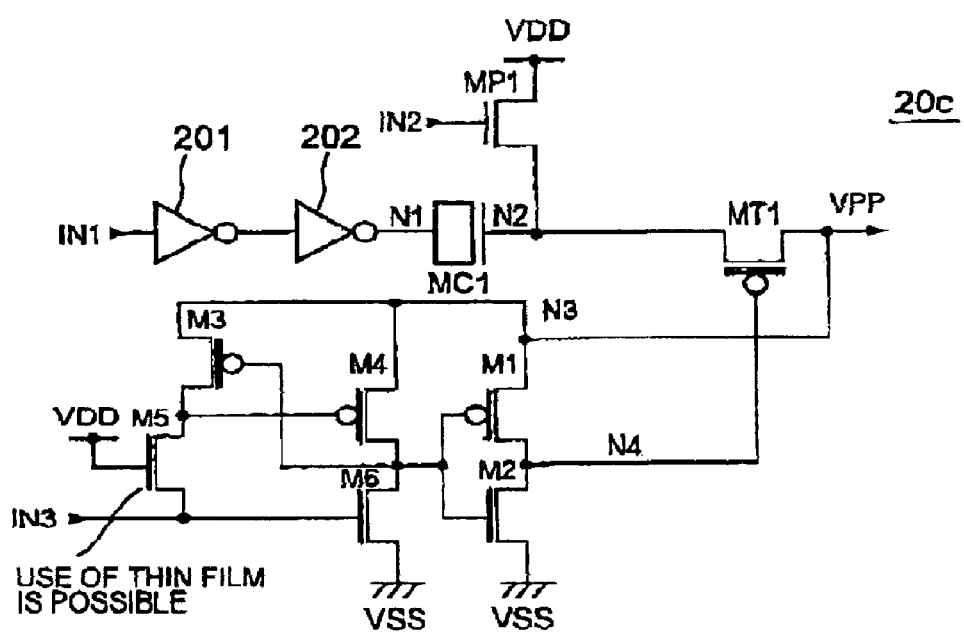
FIG. 7 is a circuit diagram explaining a boosted potential generation circuit according to a fourth embodiment of the present invention.

Referring to FIG. 7, a boosted potential generation circuit 20c of a fourth embodiment of the present invention is different from the boosted potential generation circuit 20b shown in FIG. 5 in that a P channel MOS transistor is used as a transfer MOS transistor MT1. Accordingly, the circuit of FIG. 7 does not include the second precharge MOS transistor MC2 shown in FIG. 5. The boosted potential generation circuit 20c shown in FIG. 7 is similar to that of FIGS. 5 and 6 except for the fact that potential of a node N4 which is gate potential of the transfer MOS transistor MT1 changes from a 0 ground potential level ($V_{SS}$) to a $V_{PP}$ level as shown in FIG. 8, and thus detailed description thereof will be omitted.

Figure 8:
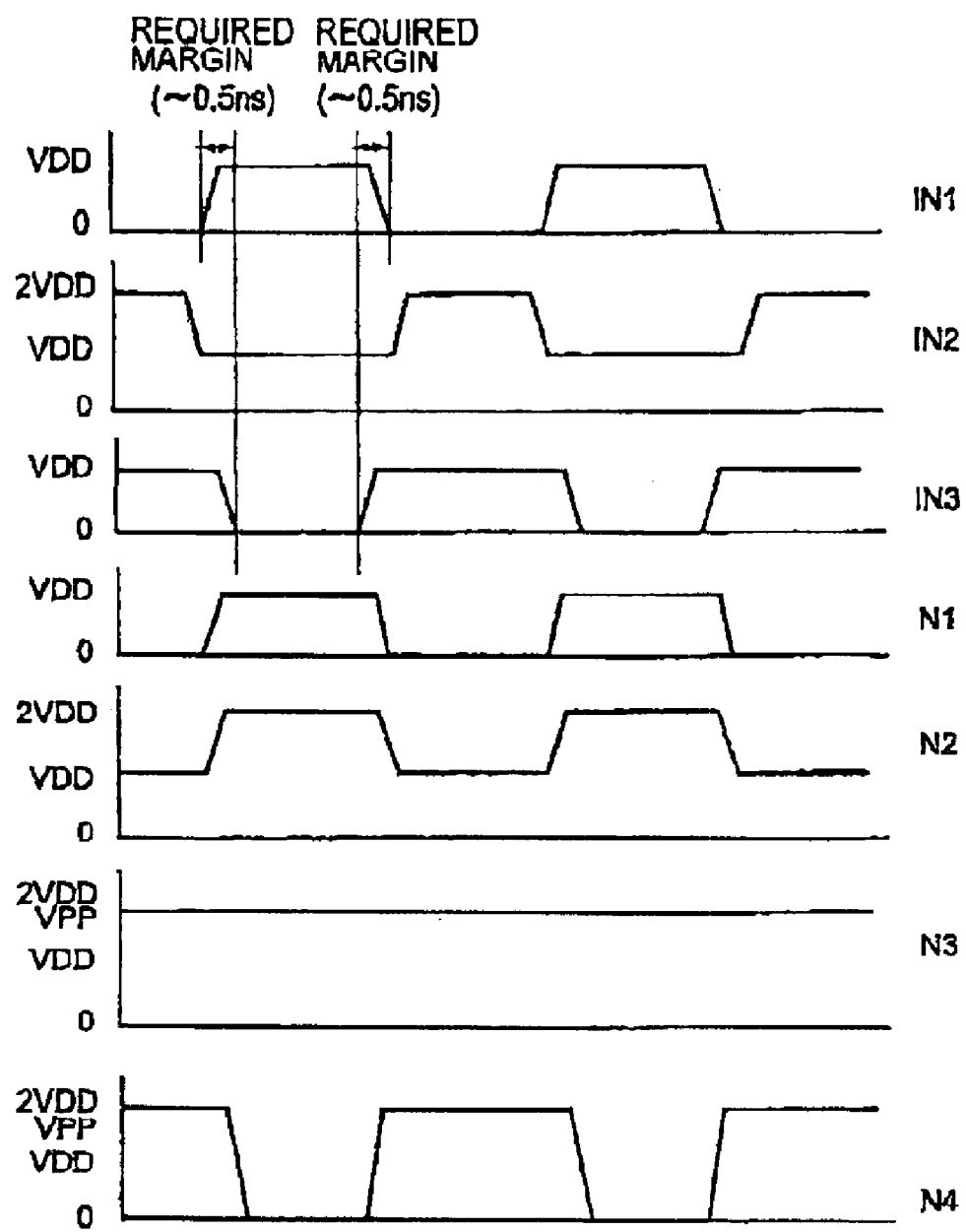
FIG. 8 is a waveform chart explaining an operation of the boosted potential generation circuit shown in FIG. 7.

As apparent from potential at a node N3 of FIG. 8, a constitution shown in FIG. 7 also enables generation of boosted potential $V_{PP}$ approaching potential of $2V_{DD}$.

In the boosted potential generation circuit 20c shown in FIG. 7, a gate insulating film of the transfer MOS transistor MT1 can be made thin as in the foregoing case. However, a thick gate film of the transfer MOS transistor MT1 is more preferable as described above.

Figure 9:
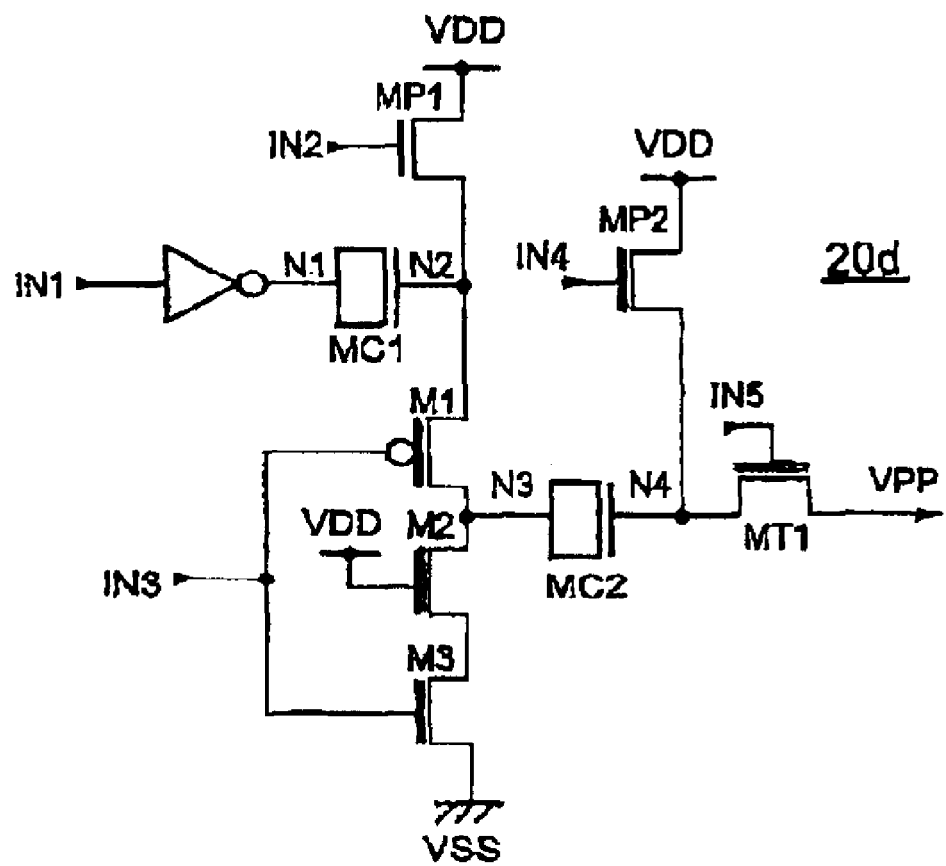
FIG. 9 is a circuit diagram explaining a boosted potential generation circuit according to a fifth embodiment of the present invention.

Referring to FIG. 9, a boosted potential generation circuit 20d of a fifth embodiment of the present invention has a constitution including a plurality of capacitor MOS transistors (here, MC1, MC2), whereby triple boosted voltage $V_{PP}$ can be generated. In the shown example, a capacitor MOS transistor MC1 (first capacitor MOS transistor) and a capacitor MOS transistor MC2 (second capacitor MOS transistor) are both constituted of MOS transistors constituting memory cells or MOS transistors having thin gate oxide films compared with a gate insulating film of a transfer MOS transistor.

In FIG. 9, nodes of a substrate side and a gate side of the first capacitor MOS transistor are respectively set as first and second nodes N1 and N2. A first clock IN1 is supplied to the first node N1 through an inverter, while the second node N2 is connected to a first precharge transistor MP1. The first precharge MOS transistor MP1 has a thin gate insulating film, external power supply voltage $V_{DD}$ is supplied to a drain thereof, and a second clock IN2 is supplied to a gate thereof.

On the other hand, between the second node N2 and ground potential ($V_{SS}$), first to third MOS transistors M1 to M3 having thick gate insulating films are connected in series through a switch circuit. The first MOS transistor M1 is a P channel MOS transistor, while the second and third MOS transistors M2 and M3 are N channel MOS transistors. As shown, a third clock IN3 is supplied to gates of the first and third MOS transistors M1 and M3, and external power supply voltage $V_{DD}$ is supplied to a gate of the second MOS transistor M2.

The second capacitor MOS transistor MC2 having a thin gate insulating film is provided with a substrate side node (third node) N3 and a gate side node (fourth node) N4, and the third node N3 is connected to a common connection point of the first and second MOS transistors M1 and M2. On the other hand, the fourth node N4 is connected to a transfer MOS transistor MT1 and a source of a second precharge MOS transistor MP2. The second precharge MOS transistor MP2 and the transfer MOS transistor MT1 are both constituted of MOS transistors having thick gate insulating films.

External power supply voltage $V_{DD}$ is supplied to a drain of the second precharge MOS transistor MP2, a fourth clock IN4 is supplied to a gate thereof, and a fifth clock IN5 is supplied to a gate of the transfer MOS transistor MT1.

Figure 10:
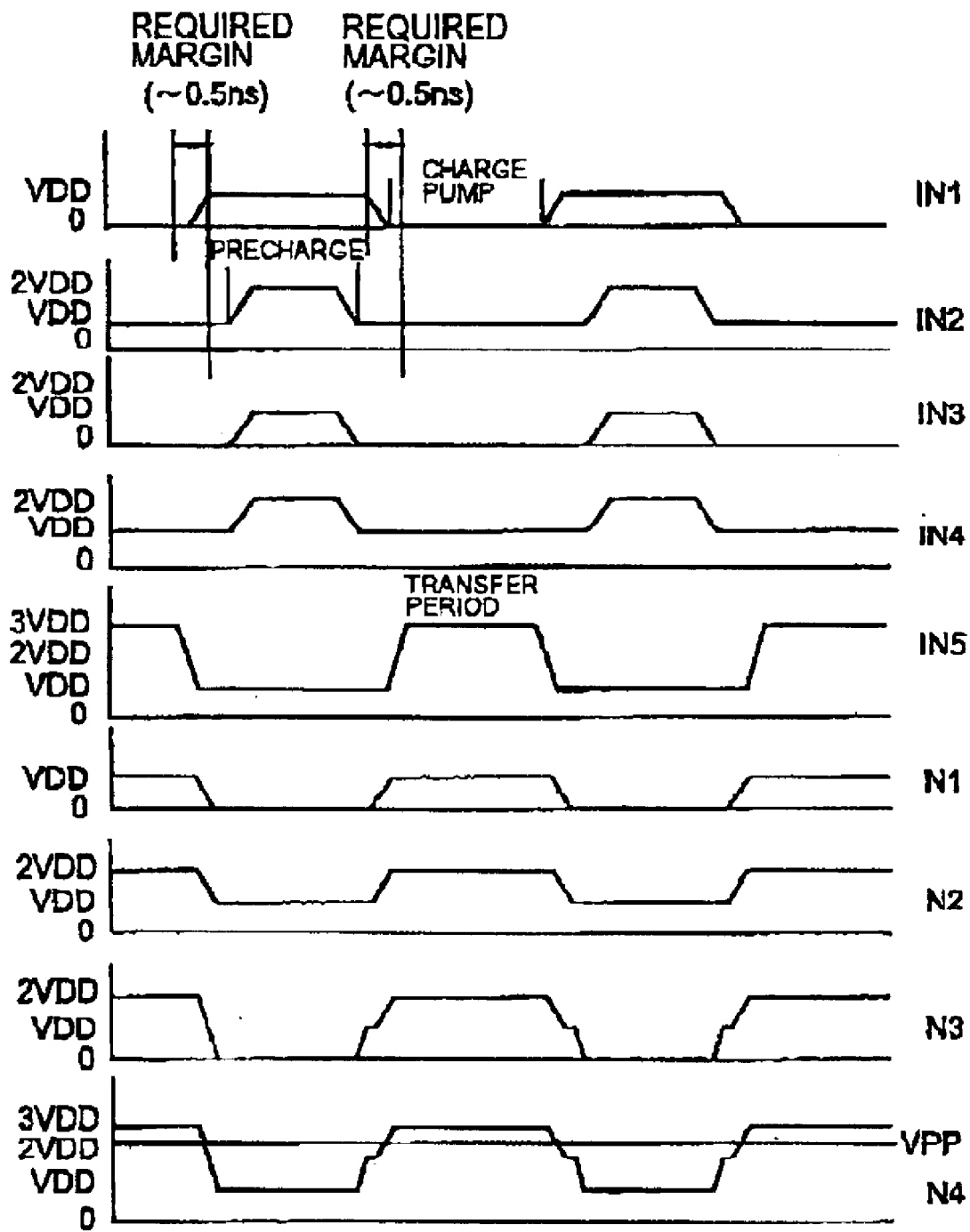
FIG. 10 is a waveform chart explaining an operation of the boosted potential generation circuit shown in FIG. 9.

FIG. 10 shows waveforms of the clocks IN1 to IN5, and potential changes at the nodes N1 to N4. First, while no clocks other than the fifth clock IN5 are supplied, i.e., a level is low and charge is not transferred, potentials of the first to fourth nodes N1 to N4 are respectively maintained at $V_{DD}$, $2V_{DD}$, $2V_{DD}$, and $3V_{DD}$.

When the first clock IN1 is supplied through the inverter, as apparent from the waveforms of the first and second nodes N1 and N2 shown in FIG. 10, the potential of the first node N1 is changed from the $V_{DD}$ level to a 0 level, and the potential of the second node N2 is changed from the $2V_{DD}$ level to a $V_{DD}$ level. In this state, since the second and fourth clocks IN2 and IN4 are at low levels, the first and second precharge MOS transistors MP1 and MP2 are maintained OFF.

Subsequently, when the third clock IN3 becomes a high level and the second and fourth clocks IN2 and IN4 become high levels, the first and second precharge MOS transistors MP1 and MP2 are turned ON. As a result, the first and second capacitor MOS transistors MC1 and MC2 are set in precharged states by external power supply voltage $V_{DD}$.

That is, when the third clock IN3 becomes a high level to turn ON the second and third MOS transistors M2 and M3, as shown in FIG. 10, the potentials of the third and fourth modes N3 and N4 are respectively reduced to 0 and $V_{DD}$ levels. Thereafter, until the second clock IN2 becomes a low level, the ON state is continued to maintain the second and fourth nodes N2 and N4 at $V_{DD}$ levels.

Then, as shown in FIG. 10, when the second, third and fourth clocks IN2, IN3 and IN4 become low levels, the first and second precharge MOS transistors MP1 and MP2 are turned ON, the first MOS transistor M1 is turned ON, and the third MOS transistor M3 is turned OFF.

When the third clock IN3 becomes a low level, the third node N3 is charged by the potential of the second node N2 to raise its potential from the ground potential 0. As a result, the potential of the fourth node N4 is also raised from the $V_{DD}$ to start a charge pump.

Further, when the first clock IN1 becomes a low level, the potentials of the first and second nodes N1 and N2 are respectively boosted to $V_{DD}$ and $2V_{DD}$ to set charge pump states. At this time, since the first MOS transistor M1 is ON, the potentials of the third and fourth nodes N3 and N4 are respectively raised to $2V_{DD}$ and $3V_{DD}$ in accordance with the potential increase of the node N2. Thus, it can be understood that in the shown example the low-level period of the first clock IN2 defines a charge pump period.

Then, as shown in FIG. 10, when the first clock IN1 becomes a low level, and the potential of the fourth node N4 reaches $3V_{DD}$, the fifth clock IN5 is set to a high level. Thus, the transfer MOS transistor MT1 is turned ON while the first clock IN1 is at a low level, and the potential of the transfer MOS transistor MT1 is set to $3V_{DD}$ to set a charge transfer state.

After the end of the charge transfer, the fifth clock IN5 becomes a low level, and the first clock IN1 subsequently becomes a high level. At this point of time, the first and second precharge MOS transistors MP1 and MP2 operated by the second and fourth clocks IN2 and IN4 are OFF, while the third MOS transistor M3 operated by the third clock IN3 is ON. In this state, when the first clock IN1 becomes a high level, the potentials of the first and second nodes N1 and N2 are respectively reduced from the $V_{DD}$ to ground potential and from the $2V_{DD}$ to $V_{DD}$. As a result, the potentials of the third and fourth nodes N3 and N4 are also changed respectively from the $2V_{DD}$ to $V_{DD}$ and from the $3V_{DD}$ to $2V_{DD}$.

When the second, third and fourth clocks IN2, IN3 and IN4 become high levels while the first clock IN1 is at a high level, the potentials of the third and fourth nodes N3 and N4 are respectively reduced from the $V_{DD}$ to 0 and from the $2V_{DD}$ to $V_{DD}$ to precharge the first and second capacitor MOS transistors MC1 and MC2. Thereafter, a similar operation is repeated.

In the example shown in FIG. 10, while the first clock IN1 is at a low level, the fifth clock IN5 is at a high level ($3V_{DD}$). This means that control is executed to allow overlapping between a charge transfer period of the transfer MOS transistor MT1 and a charge pump period defined by the low-level period of the first clock IN1, but substantially no overlapping between the high-level period of the first clock IN1 and a precharge period defined by the high-level period of the second and fourth clocks IN2 and IN4 and the charge transfer period.

In FIG. 10, control is executed to prevent overlapping between the first clock IN1 and the fifth clock IN5. However, if a MOS transistor having a thick gate insulating film is used as a second capacitor MOS transistor MC2, slight overlapping may be allowed between the first clock IN1 and the fifth clock IN5.

Figure 11:
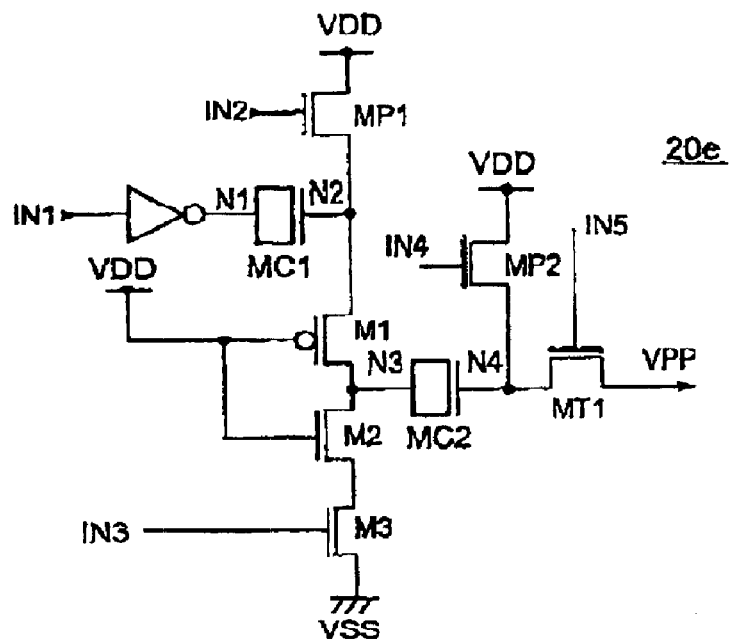
FIG. 11 is a circuit diagram explaining a boosted potential generation circuit according to a sixth embodiment of the present invention.

Referring to FIG. 11, a boosted potential generation circuit 20e of a sixth embodiment of the present invention is similar to the boosted potential generation circuit 20d shown in FIG. 9 except for the fact that first to third MOS transistors M1, M2 and M3 and a gate connection circuit thereof are changed, and operated based on a waveform chart similar to that of FIG. 10. That is, the circuit 20e shown in FIG. 11 is different from that of FIG. 9 in that the first to third MOS transistors M1, M2 and M3 are constituted of MOS transistors having thin gate insulating films, gates of the first and second MOS transistors M1 and M2 are connected in common to an external power source for supplying external power supply voltage $V_{DD}$, and a third clock IN3 is supplied only to the gate of the third MOS transistor M3. This constitution is similar to that of the circuit of FIG. 9 except for the fact that when source potential of the first MOS transistor M1 constituted of a P channel MOS becomes higher than gate potential $V_{DD}$ by threshold voltage of the transistor or more, the first MOS transistor M1 is turned ON. The shown boosted potential generation circuit 20e can also generate triple boosted potential $V_{PP}$.

Figure 12:
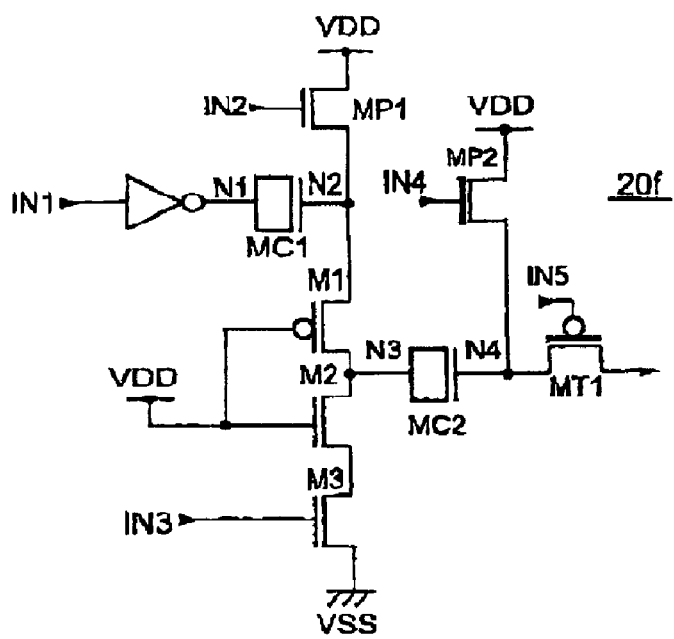
FIG. 12 is a circuit diagram explaining a boosted potential generation circuit according to a seventh embodiment of the present invention.

By referring to FIGS. 12 and 13, description will be made of a boosted potential generation circuit 20f of yet another embodiment (seventh embodiment) of the present invention. The boosted potential generation circuit 20f shown in FIG. 12 is, as in the case of FIG. 11, a circuit for generating triple boosted potential $V_{PP}$. Specifically, as in the case of FIG. 11, the boosted potential generation circuit 20f shown in FIG. 12 is constituted of MOS transistors constituting memory cells or first to third MOS transistors M1 to M3 having gate insulating films thinner than a gate insulating film of a transfer MOS transistor, gates of the first and second MOS transistors M1 and M2 are connected in common to an external power source for supplying external power supply voltage $V_{DD}$, and a third clock IN3 is supplied to the third MOS transistor M3.

Additionally, the boosted potential generation circuit 20f is different from the aforementioned boosted potential generation circuit 20e in that a P channel MOS transistor having a thick gate insulating film is used as a transfer MOS transistor MT1. Incidentally, it is similar to that shown in FIG. 11 in that the first MOS transistor M1 is constituted of a P channel transistor, and first and second capacitor MOS transistors MC1 and MC2 and first and second precharge MOS transistors MP1 and MP2 are disposed.

Now, by referring to FIG. 13, description will be made of an operation of the boosted potential generation circuit 20f shown in FIG. 12. First, a clock having a polarity opposite that of the fifth clock IN5 of FIG. 10 is supplied as a fifth clock IN5 to a gate of the transfer MOS transistor MT1. Further, in this example, as the fifth clock IN5, a clock in which $V_{DD}$ potential is set to a low level and $3V_{DD}$ potential is set to a high level is used, and the fifth clock IN5 has a high level period longer than that of a first clock IN1. In the transfer MOS transistor MT1, charge transfer is executed while the fifth clock IN5 is at a low level. Thus, it can be understood that the charge transfer time in the transfer MOS transistor MT1 does not overlap with the high-level period of the first clock IN1.

Figure 13:
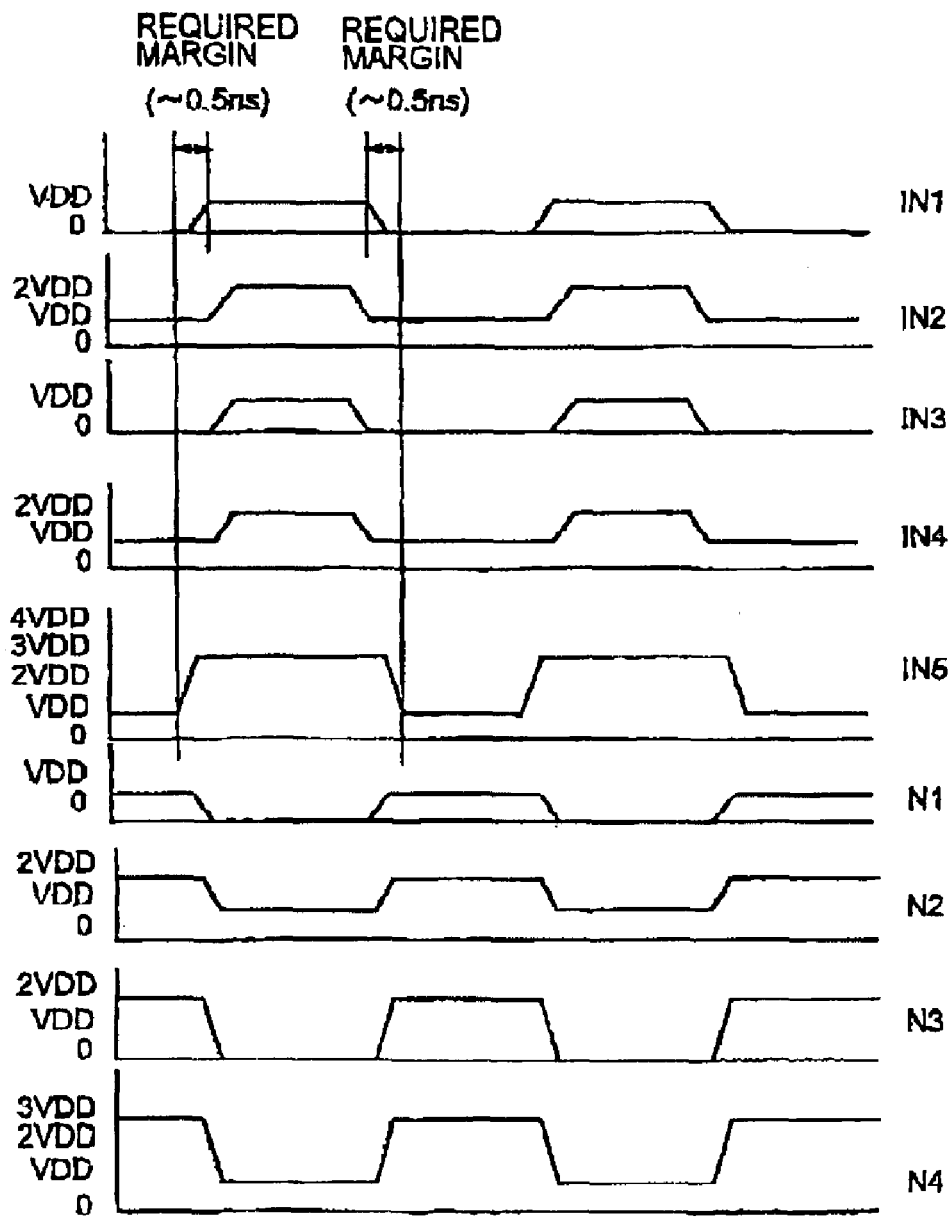
FIG. 13 is a waveform chart explaining an operation of the boosted potential generation circuit shown in FIG. 12.

Second to fourth clocks IN2 to IN4 shown in FIG. 13 are respectively similar to the second to fourth clocks shown in FIG. 10.

In FIGS. 12 and 13, first, the fifth clock IN5 is changed from $V_{DD}$ to $3V_{DD}$ to maintain the transfer MOS transistor OFF. In this state, when the first clock IN1 is changed from a 0 level to a $V_{DD}$ level, as shown in FIG. 13, potentials of nodes N1 and N2 are respectively changed from $V_{DD}$ to 0 and from $2V_{DD}$ to $V_{DD}$.

In the shown boosted potential generation circuit 20f, first, the first clock IN1 becomes a high level. As a result, the potentials of the first and second nodes N1 and N2 are respectively reduced from $V_{DD}$ to 0 and from $2V_{DD}$ to $V_{DD}$.

Subsequently, when the second, third and fourth clocks N2, N3 and N4 become high levels, the precharge MOS transistors MP1 and MP2 and the third MOS transistor M3 are turned ON, the third node N3 is reduced to 0 potential, and the second and fourth nodes N2 and N4 are precharged to $V_{DD}$ levels.

Then, when the second to fourth clocks IN2 to IN4 become low levels, the precharge MOS transistors MP1 and MP2 and the third MOS transistor M3 are turned OFF, and the second, third and fourth nodes N2, N3, and N4 respectively maintain $V_{DD}$, 0 and $V_{DD}$ levels.

Subsequently, when the first clock IN1 becomes a low level, the potentials of the nodes N1 and N2 are respectively set to $V_{DD}$ and $2V_{DD}$. When the potential of the node N2 becomes $2V_{DD}$, the first MOS transistor M1 is turned ON to raise the potentials of the nodes N3 and N4 respectively to $2V_{DD}$ and $3V_{DD}$. In this state, when the fifth clock IN5 is reduced to a low level ($V_{DD}$), the transfer MOS transistor MT1 is turned ON to transfer charge.

As a result, the boosted potential generation circuit 20f can output triple boosted potential $V_{PP}$.

As shown in FIGS. 9, 11 and 12, according to the constitution where the plurality of capacitor MOS transistors MC1, MC2 are connected substantially in series through the transistor as a switch element for executing ON/OFF operation, each capacity is charge-pumped to obtain added voltage, whereby triple boosted voltage $V_{PP}$ can be generated.

Figure 14:
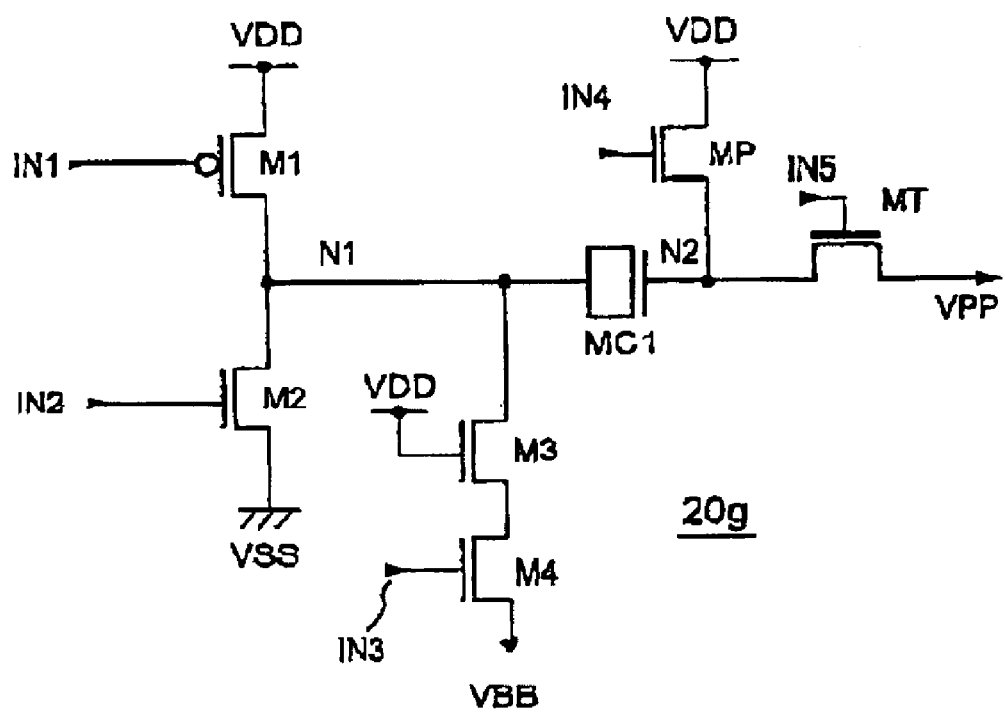
FIG. 14 is a circuit diagram explaining a boosted potential generation circuit according to an eighth embodiment of the present invention.

Referring to FIG. 14, a boosted potential generation circuit 20g of an eighth embodiment of the present invention is different from those of the previous embodiments in that in addition to positive potential $V_{DD}$ and ground potential $V_{SS}$, substrate voltage ($V_{BB}$) of about −0.7V is used.

Specifically, the boosted potential generation circuit 20g is provided with first and second MOS transistors M1 and M2 operated by respectively receiving first and second clocks IN1 and IN2. Both MOS transistors M1 and M2 are connected in series between external power supply voltage $V_{DD}$ and the ground potential $V_{SS}$, and a node N1 which is a common connection point of both MOS transistors M1 and M2 is connected to a substrate side of a capacitor MOS transistor MC1. Additionally, third and fourth MOS transistors M3 and M4 are connected in series between the node N1 and the substrate potential ($V_{BB}$). Here, the external power supply voltage $V_{DD}$ is supplied to a gate of the third MOS transistor M3, while a third clock IN3 is supplied to a gate of the fourth MOS transistor M4. The first to fourth MOS transistors M1 to M4 have thin gate insulating films. Only the first MOS transistor M1 is a P channel MOS transistor, and the other MOS transistors M2 to M4 are N channel MOS transistors.

The gate side of the capacitor MOS transistor MC1 is connected to the node N2, and a precharge MOS transistor MP and a transfer MOS transistor MT are connected to the node N2. Both MOS transistors MP and MT are N channel MOS transistors, and the transistor MT has a thick gate insulating film. Fourth and fifth clocks IN4 and IN5 are respectively supplied to gates of the MOS transistors MP and MT.

Figure 15:
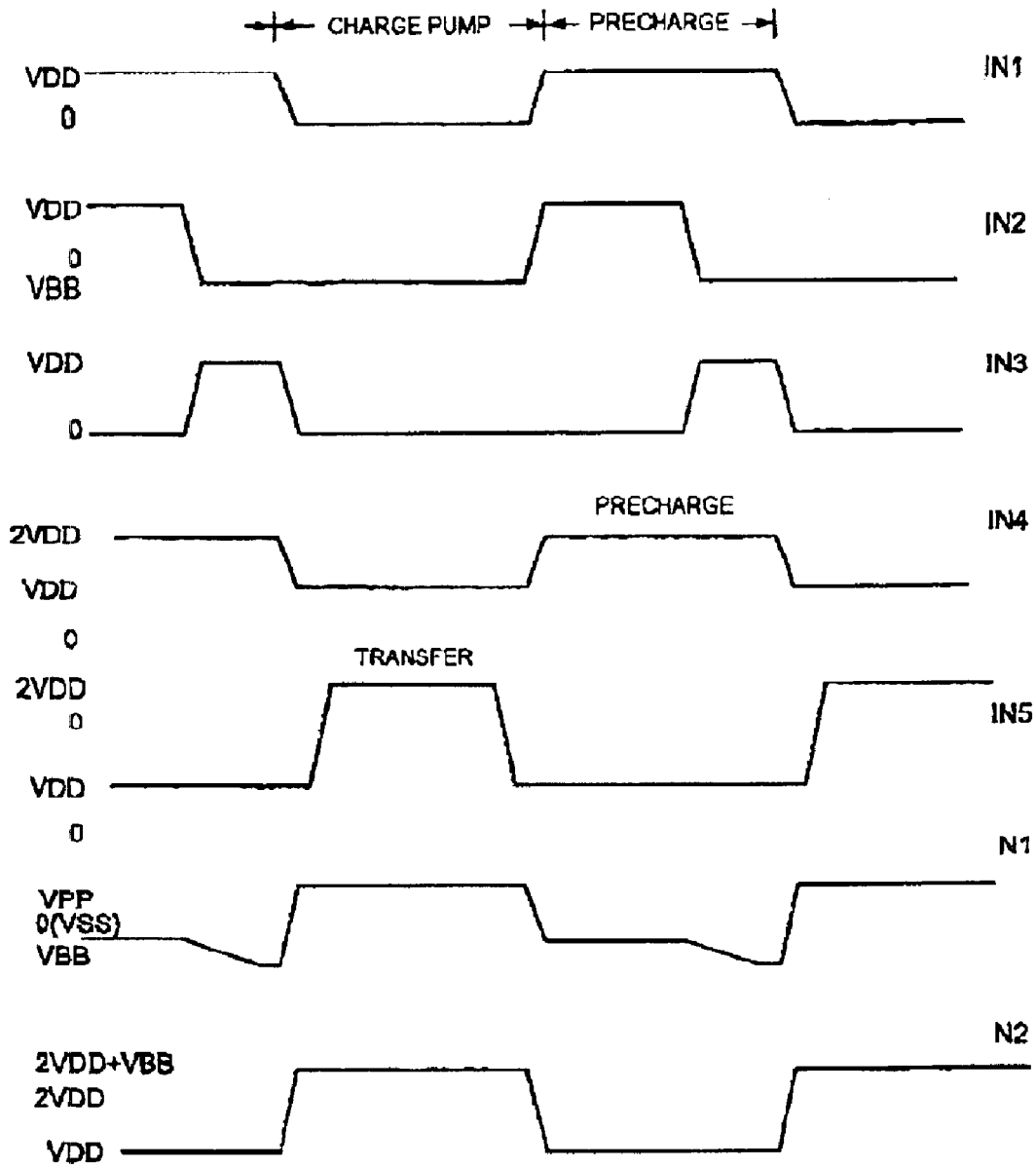
FIG. 15 is a waveform chart explaining an operation of the boosted potential generation circuit shown in FIG. 14.

Also referring to FIG. 15, the first clock IN changes between a $V_{DD}$ level and a $V_{SS}$ level, and the second clock IN2 changes between a $V_{DD}$ level and a $V_{BB}$ level. Further, the third clock IN3 has amplitude changed between a $V_{DD}$ level and a $V_{BB}$ level.

As apparent from FIG. 15, in a precharge period of the first clock IN1 which is at a high level, the second and third clocks IN2 and IN3 are set to high levels to reduce the first node N1 to a $V_{SS}$ level and a $V_{BB}$ level.

Further, the fourth clock IN4 is, as shown in FIG. 15, changed between a $2V_{DD}$ level and a $V_{DD}$ level, which timing is similar to that of the first clock IN1. Additionally, the fifth clock IN5 which becomes a high level in a low-level period of the first clock IN1, i.e., in a charge pump period, is changed between $V_{DD}$ and $3V_{DD}$.

In FIG. 14, the first node N1 is at a $V_{SS}$ level while potential of the second clock IN2 is at a high level, and when the second clock IN2 is changed to a low level, the second MOS transistor M2 is turned OFF, the third clock IN3 supplied to the fourth MOS transistor M4 becomes a high level ($V_{DD}$), and the fourth MOS transistor M4 is turned ON together with the third MOS transistor M3. As a result, as shown in FIG. 15, the potential of the node N1 is reduced to $V_{BB}$. This means that the potential of the node N1 first reduced to the $V_{SS}$ (ground potential) is further reduced to the $V_{BB}$ to execute precharging.

Subsequently, when the first, third and fourth clocks IN1, IN3 and IN4 are reduced to low levels, the precharge period is completed to turn OFF the third and fourth MOS transistors M3 and M4 and the precharge MOS transistor MP. At this time, the first MOS transistor M1 is turned ON, and the potential of the first node N1 starts to rise toward a $V_{DD}$ level to set a charge pump period. During this period, the level of the first node N1 is increased from $V_{BB}$ to $V_{DD}$ to raise the potential of the second node N2 to a $2V_{DD}+V_{BB}$ level. In this case, when the fifth clock IN5 reaches $3V_{DD}$, the transfer MOS transistor MT is turned ON to transfer charge.

Thus, according to the embodiment, by discharging the potential of the node N1 to the ground potential ($V_{SS}$) and then reducing it to the negative potential ($V_{BB}$), it is possible to reduce a load on the negative power source more compared with the direct reduction to the negative potential. Accordingly, the boosted potential generation circuit 20g shown in FIG. 14 can obtain a boosted level of $2V_{DD}+V_{BB}$ by using the VBB power source, i.e., only one capacitor MOS transistor. In this case, a difference of potential applied to the capacitor MOS transistor is larger than $V_{DD}$, but smaller than $2V_{DD}$, and thus a thin film gate can be used.

In order to manufacture the aforementioned boosted potential generation circuit of each embodiment, it is necessary to prepare MOS transistors having gate insulating films different from each other.

Figure 16A:
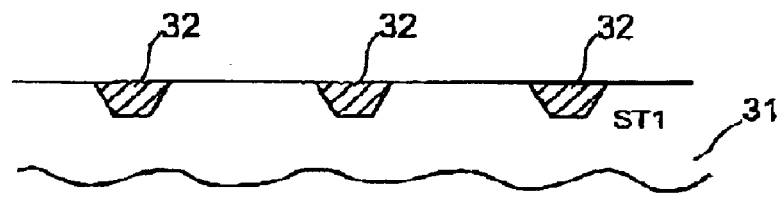
FIGS. 16A to 16F are views explaining a process of manufacturing a MOS transistor used for a boosted potential generation circuit of the present invention.
Figure 16B:
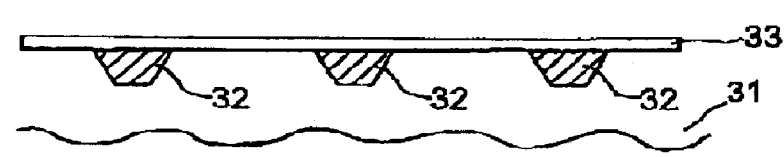

By referring to FIGS. 16A to 16F, description will be made of a multioxide process used for manufacturing MOS transistors different from each other in film thickness. First, as shown in FIG. 16A, insulating regions 32 are selectively set on a silicon substrate 31 by shallow trench isolation (STI). Accordingly, the silicon substrate 31 is divided into a plurality of regions insulated from one another. Then, a first insulating film 33 is formed on the surfaces of the silicon substrate 31 and the insulating regions 32 (FIG. 16B).

Figure 16C:
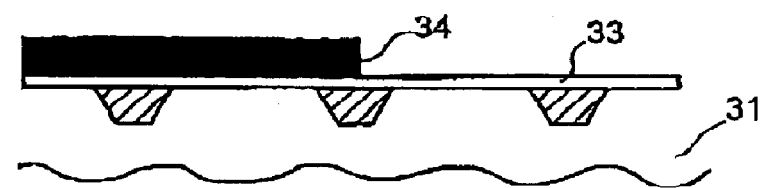
Figure 16D:
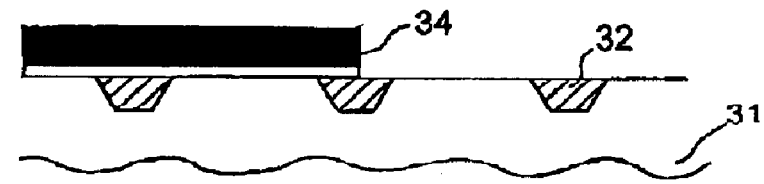
Figure 16E:
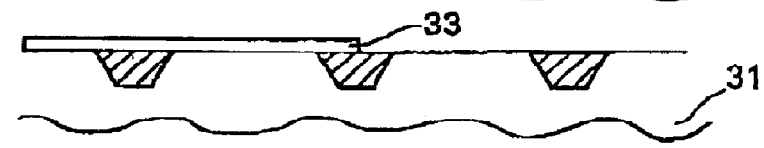
Figure 16F:

Subsequently, as shown in FIG. 16C, a resist film 34 is selectively applied on the first insulating film 33, and then the first insulating film 33 of a part not covered with the resist film 34 is etched to partially expose the silicon substrate 31 and the insulating region 32 (FIG. 16D). In this state, the resist film 34 is removed to expose the first insulating film 33 (FIG. 16E), and a second insulating film 35 is formed on the first insulating film 3, the silicon substrate 31 and the insulating region 32 which have been exposed.

As a result, a thick insulating film is formed in a region where the first and second insulating films 33 and 35 are laminated, while a thin insulating film is formed in a region where the first insulating film 33 is not formed. Thus, the use of the multioxide process enables formation of thick and thin insulating films. Moreover, use of the thick and thin insulating films as gate insulating films of MOS transistors constituting a boosted potential generation circuit enables manufacturing of a MOS transistor used for the aforementioned embodiment.

Now, by referring to FIG. 17, description will be made of a boosted potential generation circuit of yet another embodiment (ninth embodiment) of the present invention. The boosted potential generation circuit of this embodiment is used as an overdrive power supply circuit of a bit line sense amplifier (SA). In the shown example, an internal step-down circuit 41 for stepping down external power supply voltage $V_{DD}$ to obtain internal stepped-down potential $V_{DL}$ is connected to the overdrive power supply circuit. In this example, instead of directly using an external power source, the internally stepped-down potential $V_{DL}$ is supplied to the overdrive power supply circuit and, by the overdrive power supply circuit, boosted potential VDARY is supplied through a driving MOS transistor MD to the sense amplifier SA. According to this constitution, effects of level fluctuation of the boosted potential VDARY caused by level fluctuation of the external power source can be suppressed. Moreover, by using the internal step-down circuit 41, compared with the case of using the external power source, a gate insulating film of a capacitor MOS transistor MC1 having a capacity necessary for a bit line can be made thin, whereby an area required by the capacitor MOS transistor MC1 can be reduced.

Figure 17:
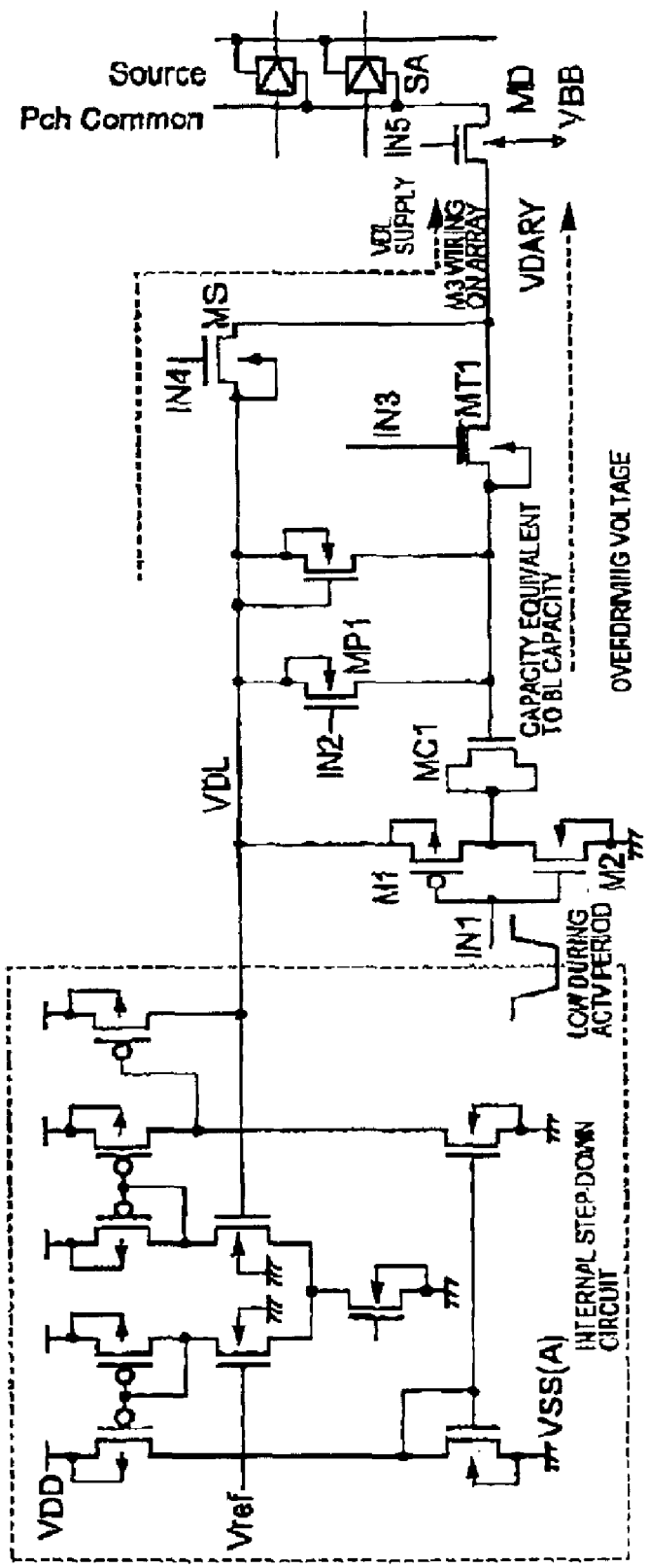
FIG. 17 is a circuit diagram explaining a boosted potential generation circuit according to a ninth embodiment of the present invention.

The overdrive power supply circuit shown in FIG. 17 is provided with a series circuit of a P channel first MOS transistor M1 and an N channel second MOS transistor M2 connected between the internally stepped-down potential $V_{DL}$ and the ground, and the aforementioned capacitor MOS transistor MC1 is connected to a common connection point of both MOS transistors M1 and M2. A precharge MOS transistor MP1 and a transfer MOS transistor MT1 are connected to a gate side of the capacitor MOS transistor MC1. Further, the shown circuit is provided with a switching MOS transistor MS for selectively supplying the $V_{DL}$ potential.

In this case, a first clock IN1 is supplied to gates of the MOS transistors M1 and M2, a second clock IN2 to a gate of the precharge MOS transistor MP1, a third clock IN3 to a gate of the transfer MOS transistor MT1, a fourth clock IN4 to the switching MOS transistor MS, and a fifth clock IN5 to the driving MOS transistor MD.

Figure 18:
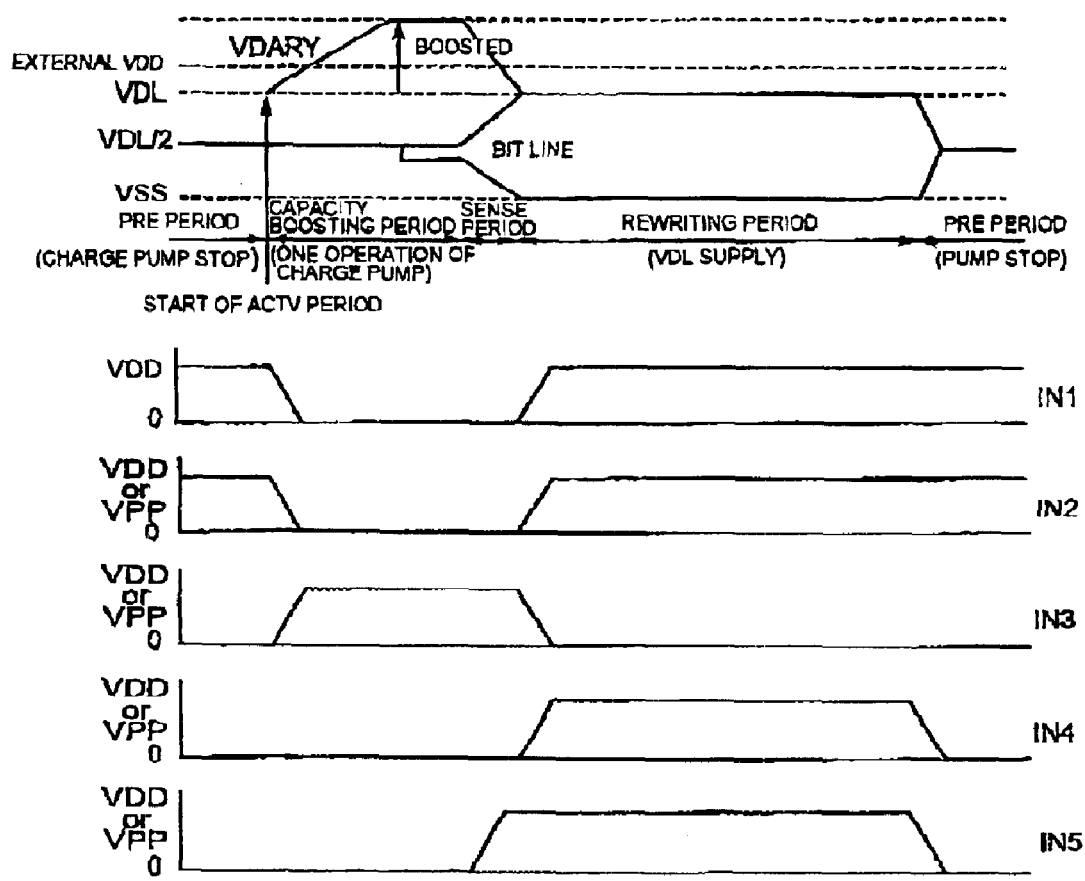
FIG. 18 is a waveform chart explaining an operation of the boosted potential generation circuit shown in FIG. 17.

An operation of FIG. 17 will now be described more specifically by referring to FIG. 18. The external power supply voltage $V_{DD}$ is stepped down by the internal step-down circuit 41 to be supplied to the overdrive power supply circuit. In this state, in the precharge MOS transistor MP1, the second clock IN2 is at a high level during a precharge period as shown in FIG. 18, and the precharge MOS transistor MP1 is turned ON to precharge the capacitor MOS transistor MC1. Additionally, in this state, since the first clock IN1 is at a high level, the first MOS transistor M1 is OFF.

Then, the first and second clocks IN1 and IN2 become low levels to change the precharge period to a charge pump period. During this period, the third clock IN3 becomes a high level. In this charge pump period, the precharge MOS transistor MP1 is turned OFF by the second clock IN2, and the low level of the first clock IN1 is entered as an ACTV signal to the gates of the first and second MOS transistors M1 and M2. As a result, the first MOS transistor M1 is turned ON, while the precharge MOS transistor MP1 is turned OFF by the second clock IN2, and the transfer MOS transistor MT1 is turned ON. Accordingly, boosting is executed during this period, and boosted potential VDARY is outputted from the transfer MOS transistor MT1.

At this time, since the fourth clock IN4 is at a low level, the switching MOS transistor MS is OFF. On the other hand, the driving MOS transistor MD is turned OFF by the fifth clock IN5, and overdriving charge is supplied from the transfer MOS transistor MT1 through the driving MOS transistor MS to the sense amplifier (SA).

In the shown example, about the time of the end of bit line amplification, the first and second clocks IN1 and IN2 are changed to high levels, while the third clock IN3 is changed to a low level. Further, a signal indicating a rewriting period is supplied as the fourth clock IN4 to the switching MOS transistor MS, and the switching MOS transistor MS is turned ON to be switched to $V_{DL}$ (bit line high level power supply). When the switching is finished, the capacitor MOS transistor is set in a precharged state.

Thus, the shown overdrive power supply circuit has an advantage that different from the conventional case it is not necessary to individually lay an overdrive power supply line and a $V_{DL}$ power supply line because the $V_{DL}$ and the boosted overdrive power supply voltage VDARY can be selectively supplied.

Furthermore, a gate insulating film of the capacitor MOS transistor constituting the shown overdrive power supply circuit is thinner than a gate insulating film of the MOS transistor constituting the DRAM memory cell. However, these films may be set equal to each other in thickness.

As described above, according to the present invention there is an advantage that the gate insulating film of the capacitor MOS transistor is made thin to realize a small area and a large capacity. According to the present invention, there is also an advantage that the triple boosted potential generation circuit requiring a large capacity can be easily constituted.

What is claimed is:

1. A boosted potential generation circuit used for a semiconductor device including memory cells constituted of a MOS transistor, comprising:
    a capacitor MOS transistor used as a capacitive element and connected between first and second nodes;
    a transfer MOS transistor connected to the second node; and
    a precharge MOS transistor connected to the second node, wherein gates of the capacitor MOS transistor, the transfer MOS transistor and the precharge MOS transistor are controlled so that a potential voltage difference between the first and second nodes of the capacitor MOS transistor is not higher than a withstand voltage of a gate insulating film of the capacitor MOS transistor;
    a first clock, a second clock, and a third clock being provided to said boosted potential generation circuit as control signals.

2. The boosted potential generation circuit according to claim 1, wherein the capacitor MOS transistor has the gate insulating film thinner than a gate insulating film of the MOS transistor constituting the memory cell or the transfer MOS transistor.

3. The boosted potential generation circuit according to claim 1, wherein the first node is given the first clock as a control signal while the gates of the precharge MOS transistor and the transfer MOS transistor are given the second clock and the third clock as control signals, respectively, the capacitor MOS transistor having a charge pump period that is defined by the first clock and that is controlled not to overlap with a precharge period of the precharge MOS transistor defined by the second clock, while the third clock defines a transfer period shorter than the charge pump period.

4. The boosted potential generation circuit according to claim 1, wherein the precharge MOS transistor is given an external power supply voltage and generates an electric potential that is equal to twice the external power supply voltage generated from the transfer MOS transistor.

5. The boosted potential generation circuit according to claim 4, wherein the transfer MOS transistor has a thick gate insulating film of a thickness equal to that of the memory cell, and the third clock supplied to the gate of the transfer MOS transistor has an amplitude equal to twice the external power supply voltage.

6. The boosted potential generation circuit according to claim 4, wherein the transfer MOS transistor has a thin gate insulating film of a thickness equal to that of the capacitor MOS transistor, and the third clock supplied to the gate of the transfer MOS transistor has an amplitude equal to the external power supply voltage.

7. A boosted potential generation circuit for boosting an external power supply voltage, comprising:
    a first capacitor MOS transistor connected between first and second nodes;
    a second capacitor MOS transistor connected between third and fourth nodes;
    a first precharge MOS transistor connected between the second node and a power supply terminal to which the external power supply voltage is supplied;
    a second precharge MOS transistor connected between the power supply terminal and the fourth node; and
    a transfer MOS transistor connected to the fourth node,
    wherein a switch circuit is disposed between the second and third nodes, and the transfer MOS transistor generates an electric potential three times as large as the external power supply voltage.

8. The boosted potential generation circuit according to claim 7, wherein the first and second capacitor MOS transistors are structured by MOS transistors having gate insulating films thinner than a gate insulating film of each MOS transistor constituting the memory cell or the transfer MOS transistor.

9. The boosted potential generation circuit according to claim 7, wherein the switch circuit has a first MOS transistor connected between the second and third nodes, and second and third MOS transistors connected between the third node and a ground.

10. The boosted potential generation circuit according to claim 9, wherein the first MOS transistor is a P channel MOS transistor, while the second and third MOS transistors are N channel MOS transistors.

11. The boosted potential generation circuit according to claim 10, wherein the first to third MOS transistors have thick gate insulating films.

12. The boosted potential generation circuit according to claim 10, wherein the first to third MOS transistors have thin gate insulating films.

13. The boosted potential generation circuit according to claim 7, wherein first, second, third, fourth and fifth clocks are respectively supplied as control signals to the first capacitor MOS transistor, the first precharge MOS transistor, the switch circuit, the second precharge MOS transistor, and the transfer MOS transistor;
    the transfer MOS transistor having a charge transfer period that is defined by the fifth clock and that substantially overlaps with a charge pump period of the first capacitor MOS transistor defined by the first clock, and that does not overlap substantially with a precharge period defined by the second and fourth clocks.

14. The boosted potential generation circuit according to claim 13, wherein, in the precharge period defined by the second and fourth clocks, the switch circuit makes the second and third nodes nonconductive to each other and sets the third node to a low level, and the switch circuit makes the second and third nodes conductive to each other in the charge pump period.

15. The boosted potential generation circuit according to claim 13, wherein the transfer MOS transistor is structured by a P channel MOS transistor, and the switch circuit has a P channel first MOS transistor connected between the second and third nodes, and N channel second and third MOS transistors connected in series between the third node and a ground.

16. The boosted potential generation circuit according to claim 15, wherein gates of the first and second MOS transistors are connected in common to a power supply voltage terminal, the third clock is supplied to a gate of the third MOS transistor while the second and third nodes are made nonconductive to each other and the third clock is set to a low level in the precharge period defined by the second and fourth clocks, and the second and third nodes are made conductive to each other in the charge pump period.

17. The boosted potential generation circuit according to claim 16, wherein the first to third MOS transistors, and the first and second capacitor MOS transistors have thin gate insulating films.

18. The boosted potential generation circuit according to claim 17, wherein the first precharge MOS transistor has a thin gate insulating film, while the second precharge MOS transistor and the transfer MOS transistor have thick gate insulating films.

19. A control method for use in controlling a boosted potential generation circuit which includes a capacitor MOS transistor provided with a gate insulating film of a predetermined thickness, a transfer MOS transistor provided with a gate insulating film thicker than the gate insulating film of the capacitor MOS transistor, and a precharge MOS transistor connected to the capacitor MOS transistor and the transfer MOS transistor, comprising the steps of:
  supplying, to the capacitor MOS transistor, a first clock for defining a charge pump period;
  supplying, to the precharge MOS transistor, a second clock for deciding a precharge period finished before a start of the charge pump period by the first clock; and
  supplying, to the transfer MOS transistor, a third clock for defining a charge transfer period within the charge pump period by the first clock,
  whereby a voltage applied to the capacitor MOS transistor during the boosting period is controlled.

20. The control method according to claim 19, wherein the third clock has an amplitude greater than that of the first clock.

21. The control method according to claim 19, wherein a voltage applied to the capacitor MOS transistor during both the charge pump period and the precharge period is lower than a withstand pressure of the gate insulating film of the capacitor MOS transistor.

22. A boosted potential generation circuit used for a semiconductor device including memory cells structured by MOS transistors, comprising:
  a capacitor MOS transistor used as a capacitive element and connected between first and second nodes;
  a transfer MOS transistor connected to the second node;
  a precharge MOS transistor connected to the second node;
  a circuit connected to the first node of the capacitor MOS transistor to boost the capacitor MOS transistor; and
  a circuit for setting potential of the first node to a substrate potential not higher than a ground potential.

* * * * *